United States Patent
Cheng et al.

(10) Patent No.: US 9,591,746 B2
(45) Date of Patent: Mar. 7, 2017

(54) ELECTRONIC DEVICE PACKAGE, ELECTRONIC DEVICE STRUCTURE AND METHOD OF FABRICATING ELECTRONIC DEVICE PACKAGE

(71) Applicant: Industrial Technology Research Institute, Hsinchu (TW)

(72) Inventors: Wei-Yuan Cheng, Hsinchu County (TW); Chen-Chu Tsai, Taichung (TW); Yuh-Zheng Lee, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/199,913

(22) Filed: Jun. 30, 2016

(65) Prior Publication Data

US 2016/0315044 A1 Oct. 27, 2016

Related U.S. Application Data

(63) Continuation-in-part of application No. 14/620,214, filed on Feb. 12, 2015, now Pat. No. 9,408,300.

(30) Foreign Application Priority Data

Dec. 16, 2014 (TW) .............................. 103143848 A

(51) Int. Cl.
*H05K 1/00* (2006.01)
*H05K 3/00* (2006.01)
(Continued)

(52) U.S. Cl.
CPC ......... *H05K 1/028* (2013.01); *H01L 21/6835* (2013.01); *H01L 23/3128* (2013.01);
(Continued)

(58) Field of Classification Search
CPC ...... H05K 1/028; H05K 1/115; H05K 3/4038; H05K 3/007
See application file for complete search history.

(56) References Cited

U.S. PATENT DOCUMENTS

2013/0002685 A1 1/2013 Shenoy et al.
2014/0094079 A1 4/2014 Ito et al.

FOREIGN PATENT DOCUMENTS

| TW | 201221268 | 6/2012 |
| TW | I381558 | 1/2013 |
| TW | 201442577 | 11/2014 |

OTHER PUBLICATIONS

"Office Action of Taiwan Counterpart Application", issued on Jul. 27, 2016, p. 1-p. 9.
(Continued)

*Primary Examiner* — Jeremy C Norris
(74) *Attorney, Agent, or Firm* — Jianq Chyun IP Office

(57) ABSTRACT

According to embodiments of the disclosure, an electronic device package may include a wire layer and a rigid element. The wire layer includes a first surface and a second surface opposite to each other, and the second surface of the wire layer has at least one coarse structure. A portion of the second surface having the coarse structure has a greater roughness than another portion of the second surface. The rigid element is disposed on the first surface of the wire layer, wherein a stiffness of the rigid element is greater than a stiffness of the wire layer and a projection area of the coarse structure on the first surface of the wire layer overlaps an edge of the rigid element.

24 Claims, 45 Drawing Sheets

(51) Int. Cl.
  H05K 1/02       (2006.01)
  H01L 23/498     (2006.01)
  H01L 23/31      (2006.01)
  H01L 21/683     (2006.01)
  H05K 1/11       (2006.01)
  H05K 3/40       (2006.01)
(52) U.S. Cl.
  CPC ...... *H01L 23/3135* (2013.01); *H01L 23/4985* (2013.01); *H01L 23/49827* (2013.01); *H01L 23/49838* (2013.01); *H05K 1/0281* (2013.01); *H05K 1/115* (2013.01); *H05K 3/007* (2013.01); *H05K 3/4038* (2013.01); *H01L 2221/68318* (2013.01); *H01L 2221/68345* (2013.01); *H01L 2221/68359* (2013.01); *H01L 2221/68381* (2013.01); *H05K 3/0032* (2013.01); *H05K 2201/0145* (2013.01); *H05K 2201/0154* (2013.01); *H05K 2201/10106* (2013.01); *H05K 2201/10128* (2013.01); *H05K 2201/2009* (2013.01); *H05K 2203/1178* (2013.01)

(56)        References Cited

OTHER PUBLICATIONS

Heise et al., "Optimization of picosecond laser structuring for the monolithic serial interconnection of CIS solar cells," Progress in Photovoltaics: Research and Applications, Jun. 2013, pp. 681-692.

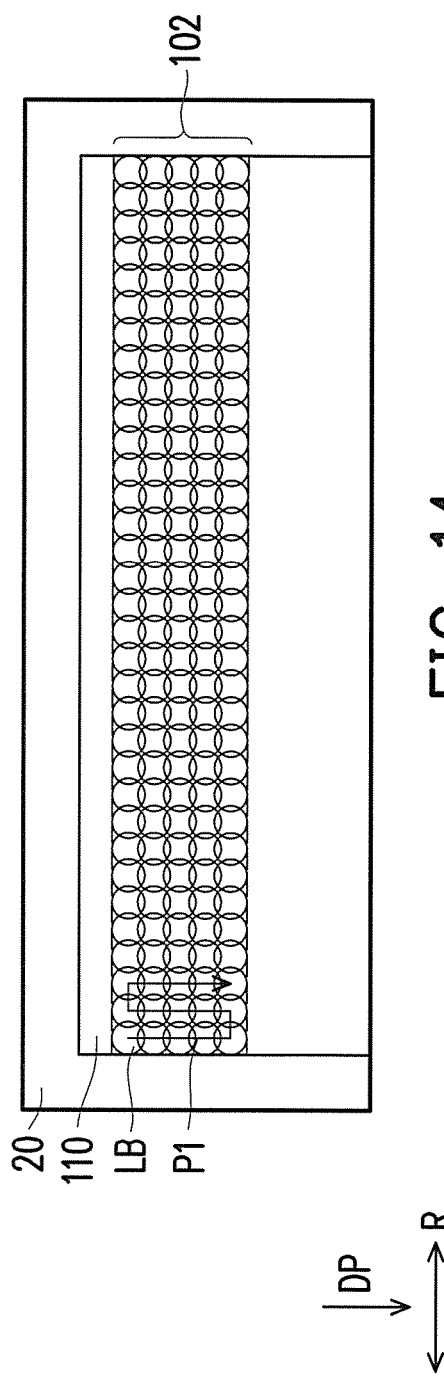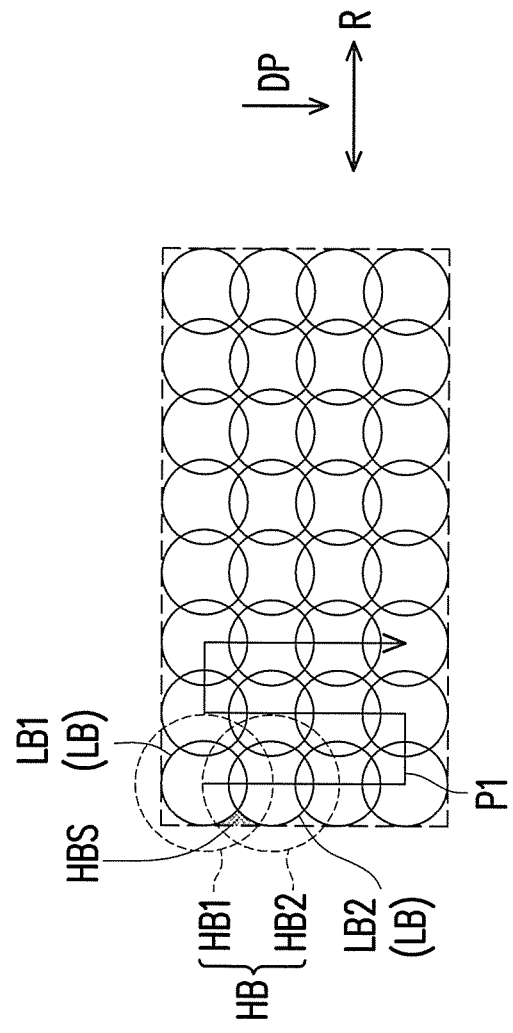
FIG. 14
FIG. 15

ELECTRONIC DEVICE PACKAGE, ELECTRONIC DEVICE STRUCTURE AND METHOD OF FABRICATING ELECTRONIC DEVICE PACKAGE

CROSS-REFERENCE TO RELATED APPLICATION

This application is a continuation-in-part application of and claims the priority benefit of a prior application Ser. No. 14/620,214, filed on Feb. 12, 2015, which claims the priority benefit of Taiwan application serial no. 103143848, filed on Dec. 16, 2014. The entirety of each of the above-mentioned patent applications is hereby incorporated by reference herein and made a part of this specification.

TECHNICAL FIELD

The disclosure relates to an electronic device package, electronic device structure and method of fabricating electronic device package.

BACKGROUND

A flexible device needs a flexible substrate to achieve the characteristic of flexibility. However, the flexibility characteristic of the flexible substrate causes the issue that an electronic element may not be directly fabricated on the flexible substrate. To fabricate an electronic element on the flexible substrate, the flexible substrate needs to be adhered on a rigid carrier or machine, so as to provide a suitable support via the carrier or the machine, and thereby the electronic element may be formed on the flexible substrate. In this way, after the fabrication of the electronic element is complete, the flexible substrate needs to be removed from the rigid carrier or machine.

A release layer may be used to join the flexible substrate and the carrier, after the fabrication of the electronic element is complete, the flexible substrate may be removed from the carrier. A suitable peel force is applied via a mechanical stripping technique to separate the flexible substrate from the carrier. The adhesion provided by the release layer is not high, and therefore a large peel force does not need to be applied during mechanical stripping. However, when an electronic element is fabricated on the flexible substrate, the stiffness of the overall device is not uniform, that is, the stiffness of some areas is relative greater, and therefore different peel forces need to be applied during mechanical stripping. Damage to elements may occur in the area to which a greater peel force is applied, which is not good for production yield.

SUMMARY

According to one embodiment of the disclosure, an electronic device package including a wire layer and a rigid element is provided. The wire layer includes a first surface and a second surface opposite to each other, and the second surface of the wire layer has at least one coarse structure. A portion of the second surface having the coarse structure has a greater roughness than another portion of the second surface. The rigid element is disposed on the first surface of the wire layer, wherein a stiffness of the rigid element is greater than a stiffness of the wire layer and a projection area of one of the at least one coarse structure on the first surface of the wire layer overlaps an edge of the rigid element.

According to one embodiment of the disclosure, an electronic device structure including a carrier, a wire layer, a plurality of rigid elements and a releasing layer is provided. The wire layer is disposed on the carrier, wherein the wire layer has a first surface and a second surface opposite to each other, the second surface has at least one coarse structure, and a portion of the second surface having the coarse structure has a greater roughness than another portion of the second surface. The rigid elements are disposed on the wire layer, wherein each of the rigid elements is disposed on the first surface, a stiffness of the each of the rigid elements is greater than a stiffness of the wire layer, and a projection area of the coarse structure on the first surface of the wire layer overlaps an edge of the each of the rigid elements. The releasing layer is disposed between the carrier and the wire layer.

According to one embodiment of the disclosure, a method of fabricating an electronic device package is provided. A wire layer is temporarily disposed on a carrier with a releasing layer located between the carrier and the wire layer. The wire layer has a first surface and a second surface, and the second surface is in contact with the release layer. At least one rigid element is formed on the first surface of the wire layer to form a first area and a second area, and a stiffness of a portion of the first area is greater than a stiffness of the second area. A laser beam irradiates from the carrier toward the release layer located in the first area, wherein a predetermined path of the laser beam falls in the first area.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 14 is an embodiment of an irradiation method of a laser beam in the step of FIG. 2A.

FIG. 15 shows a schematic of a laser irradiation point and a heat-affected zone under an irradiation method of FIG. 14.

DETAILED DESCRIPTION OF DISCLOSED EMBODIMENTS

Figure 1A:
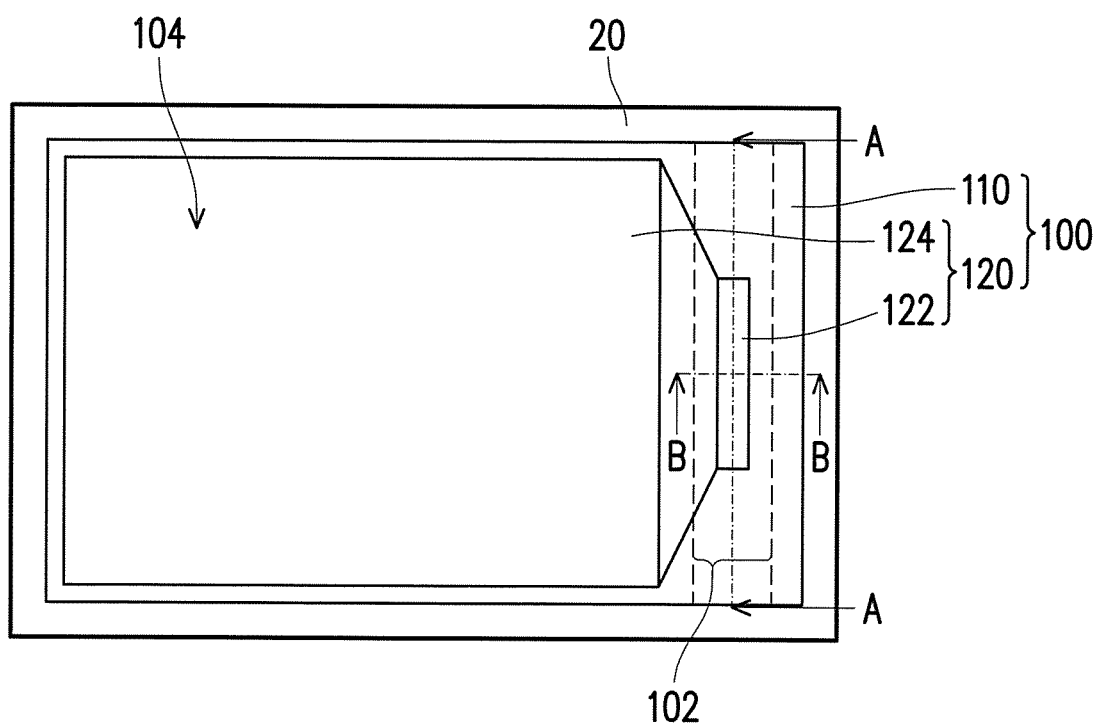
FIG. 1A is a top view of a step of a fabrication method of a flexible device of the first embodiment of the disclosure.
Figure 1B:
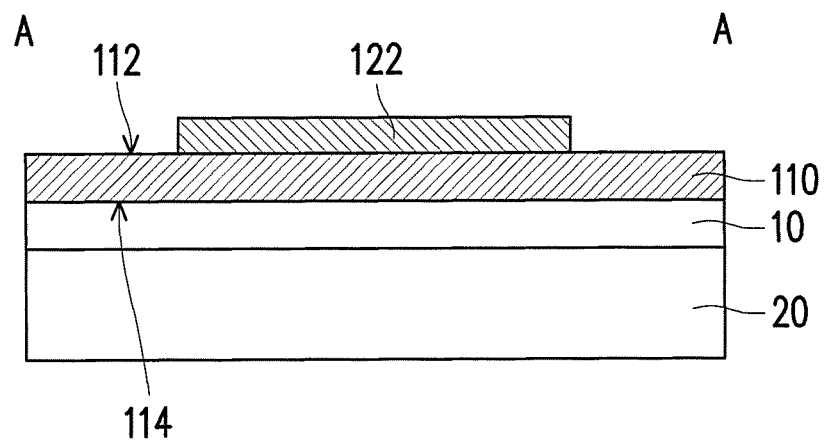
FIG. 1B is a cross-sectional view along line A-A of FIG. 1A.
Figure 1C:
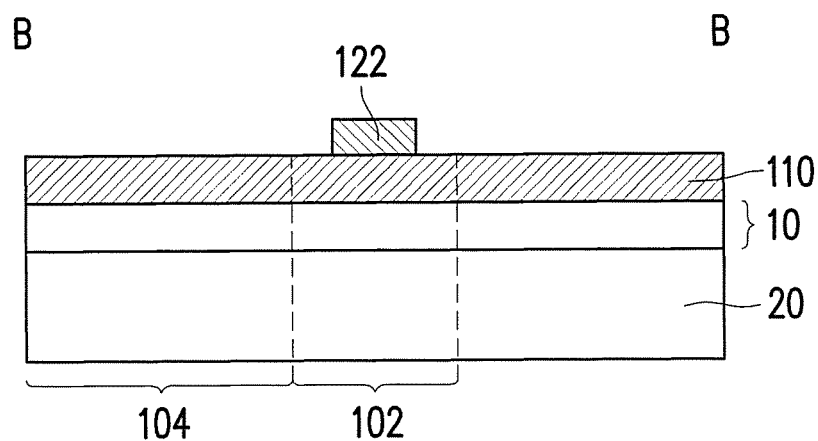
FIG. 1C is a cross-sectional view along line B-B of FIG. 1A.

FIG. 1A is a top view of a step of a fabrication method of a flexible device of the first embodiment of the disclosure, FIG. 1B is a cross-sectional view along line A-A of FIG. 1A, and FIG. 1C is a cross-sectional view along line B-B of FIG. 1A. Referring to FIG. 1A to FIG. 1C, a flexible substrate 110 may be temporarily adhered on a carrier 20 via a release layer 10, wherein the flexible substrate 110 has a first surface 112 and a second surface 114 opposite to each other, and the second surface 114 is in contact with the release layer 10. The material of the flexible substrate 110 is, for instance, a flexible material such as polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN), or polyetherimide (PEI). The flexible substrate 110 may also have a gas barrier layer. Using PI as example, such type of flexible material may be first coated in liquid state on the carrier 20 on which the release layer 10 is formed, and then a curing step is performed to form the flexible substrate 110, wherein the curing step may include a photocuring step, a thermal curing step, or other steps. In other embodiments, the PI material is fabricated into a thin-film flexible substrate 110, and in the present step, the flexible substrate 110 is temporarily adhered on the carrier 20 via the release layer 10. Moreover, since the release layer 10 is used to temporarily adhere the flexible substrate 110 on the carrier 20, the adhesion of the release layer 10 does not need to be very strong. In other words, the flexible substrate 110 may be removed from the release layer 10 in a subsequent fabrication step.

As shown in FIG. 1A to FIG. 1C, at least one element 120 is formed on the first surface 112 of the flexible substrate 110 to constitute a flexible device 100. In the present embodiment, the element 120 includes a rigid element 122 and a functional element 124, wherein the stiffness of the rigid element 122 is greater than that of the flexible substrate 110 and also greater than that of the functional element 124. Therefore, the flexible device 100 may be divided into a first area 102 and a second area 104, wherein the rigid element 122 is located in the first area 102 and the functional element 124 is located in the second area 104. Since the rigid element 122 is disposed in the first area 102, the stiffness of the flexible device 100 in the first area 102 is greater than the stiffness of the flexible device 100 in the second area 104.

In an embodiment, the rigid element 122 may be, for instance, a driving chip, and the functional element 124 may be, for instance, an organic light-emitting element, an inorganic light-emitting element, a sensing element, a display element, or a combination thereof. In other embodiments, the rigid element 122 may be an electrode, and the functional element 124 may be a battery element. In these embodiments, the rigid element 122 may be electrically connected to the functional element 124. Moreover, the rigid element 122 may be a relatively stiff member in the device, such as a seal or a lateral barrier layer, and the rigid element 122 may be disposed in the periphery of the functional element 124. The so-called stiffness may substantially be comprehensively determined via, for instance, the thickness and the Young's modulus of each layer of the element.

In general, by temporarily adhering the flexible substrate 110 on the carrier 20, desired accuracy and yield may be retained in the fabrication process of the element 120. After the needed elements 120 are all fabricated on the flexible substrate 110, the entire flexible device 100 needs to be removed from the carrier 20 so as to complete the independent flexible device 100. The adhesion provided by the release layer 10 does not have to be as strong as the average permanent adhesive layer, and therefore the flexible substrate 110 may be removed from the carrier 20 by only applying a sufficient peel force. However, when the portion to be peeled has greater stiffness or worse flexibility, the peel force needed to remove the flexible substrate 110 from the carrier 20 is significantly increased. For instance, in an embodiment, when the rigid element 122 is a packaged driving chip and the functional element 124 is an organic light-emitting element, a release force of about 3.867 kg is needed to separate the flexible substrate 110 of the location of the rigid element 122 (such as the first area 102 of the present embodiment) and the carrier 20, and a release force of less than 0.15 kg is needed to separate the other portions (such as the second area 104 of the present embodiment) from the carrier 20. Such a release force is likely to cause damage to members on the flexible substrate 110, such as wires fabricated on the flexible substrate 110 or the flexible substrate 110 itself which may break as a result, thus causing poor production yield.

Figure 2A:
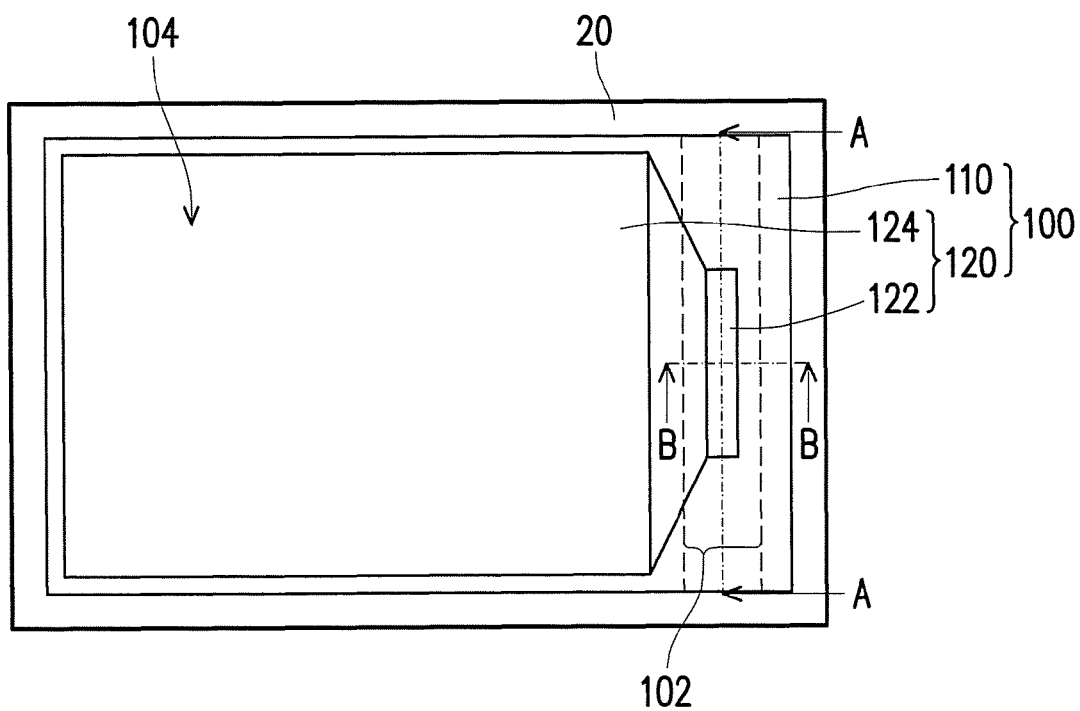
FIG. 2A is a top view of a step of a fabrication method of a flexible device of the first embodiment of the disclosure.
Figure 2B:
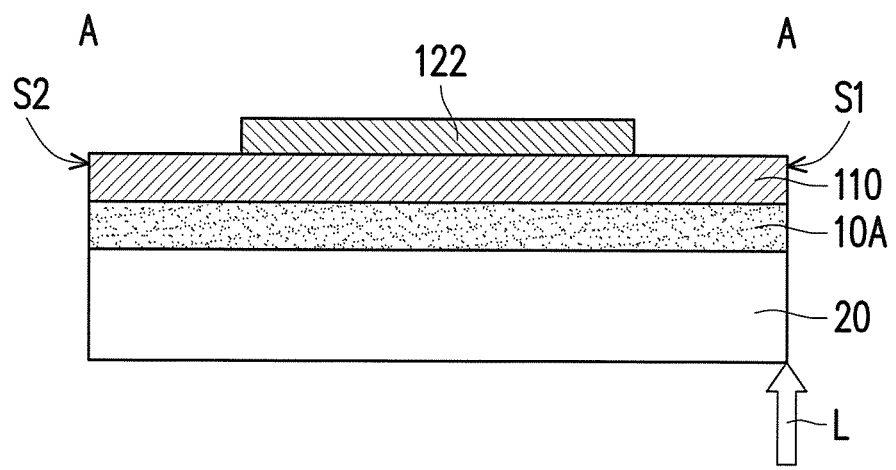
FIG. 2B is a cross-sectional view along line A-A of FIG. 2A.
Figure 2C:
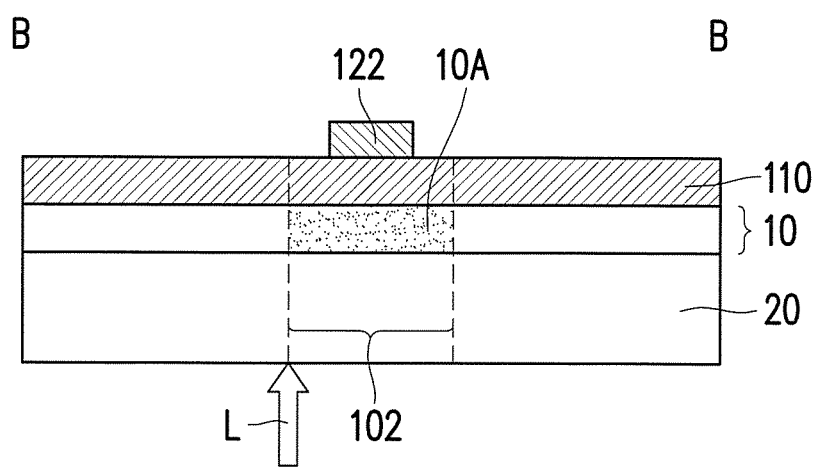
FIG. 2C is a cross-sectional view along line B-B of FIG. 2A.

In the present embodiment, before the flexible device 100 and the carrier 20 are separated, the following steps may be performed. FIG. 2A is a top view of a step of a fabrication method of a flexible device of the first embodiment of the disclosure, FIG. 2B is a cross-sectional view along line A-A of FIG. 2A, and FIG. 2C is a cross-sectional view along line B-B of FIG. 2A. Referring to FIG. 2A to FIG. 2C at the same time, a laser beam L is for instance irradiated from one side of the carrier 20 toward the release layer 10 located in the first area 102, and the irradiation path of the laser beam L falls in the first area 102. At this point, the release layer 10 irradiated by the laser beam L is decomposed or modified and converted into a release layer 10A. In the present embodiment, the path direction of the laser beam L is, for instance, from a first side S1 of the flexible substrate 110 toward a second side S2 of the flexible substrate 110, such that the release layer 10A is continuously distributed from the first side S1 to the second side S2, and the first side S1 and the second side S2 are opposite sides.

Figure 3A:
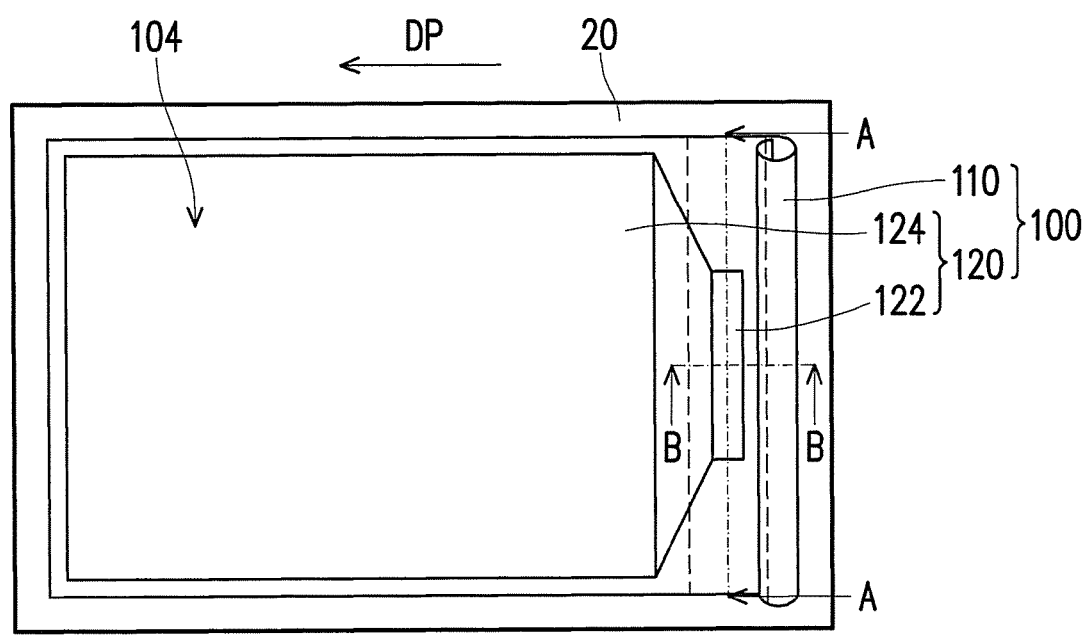
FIG. 3A is a top view of a step of a fabrication method of a flexible device of the first embodiment of the disclosure.
Figure 3B:
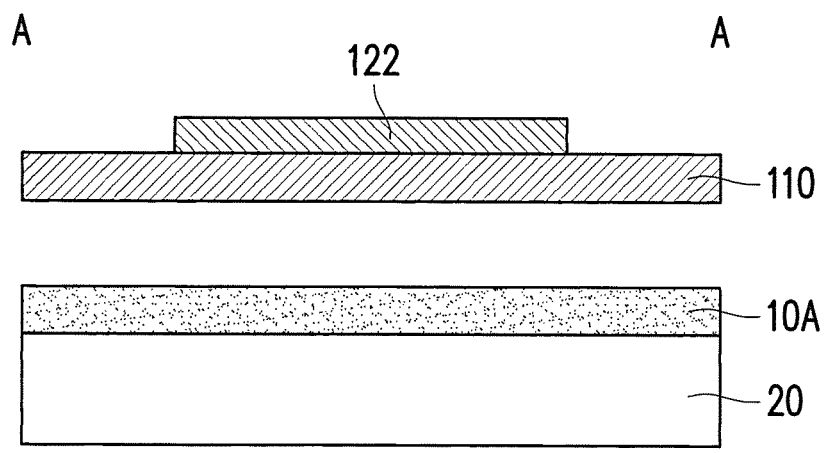
FIG. 3B is a cross-sectional view along line A-A of FIG. 3A.
Figure 3C:
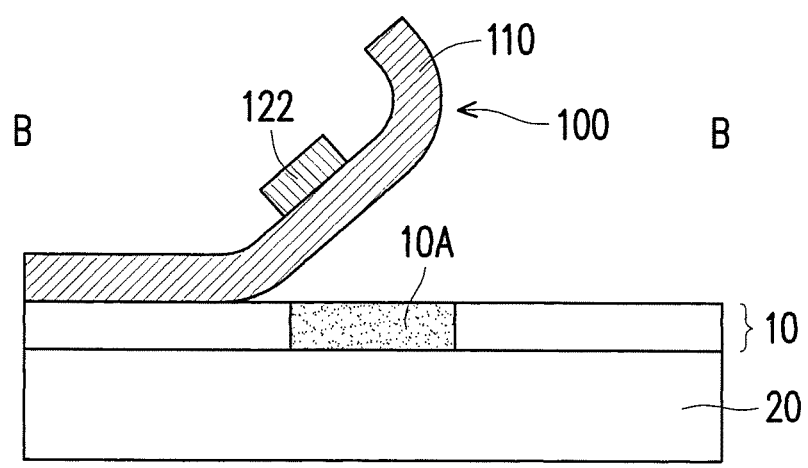
FIG. 3C is a cross-sectional view along line B-B of FIG. 3A.

FIG. 3A is a top view of a step of a fabrication method of a flexible device of the first embodiment of the disclosure, FIG. 3B is a cross-sectional view along line A-A of FIG. 3A, and FIG. 3C is a cross-sectional view along line B-B of FIG. 3A. Referring to FIG. 3A to FIG. 3C at the same time, after the irradiation of the laser beam L is conducted, the flexible device 100 is removed from the carrier 20, such that the flexible substrate 110 and the carrier 20 are separated. Here, the step of removing the flexible device 100 may include applying a peel force at one side of the flexible substrate 110 and peeling the flexible substrate 110 from the carrier 20 along a peeling direction DP.

In the step of FIG. 2A, the adhesion of the release layer 10A is damaged and is reduced when comparing with the release layer 10 without being irradiated by the laser beam L. Therefore, in the step of FIG. 3A, the peel force does not need to be significantly increased during the removal process of the first area 102 in order to separate the flexible substrate 110 of the first area 102 and the carrier 20. In an embodiment, when the rigid element 122 is a packaged driving chip and the functional element 124 is an organic light-emitting element, and the release layer 10 is converted to the release layer 10A via the processing steps of FIG. 2A to FIG. 2C, about 0.187 kg of peel force is needed to separate the flexible substrate 110 of the location of the rigid element 122 (such as the first area 102 of the present embodiment) and the carrier 20, which is a lot less than the peel force of 3.867 kg needed before the release layer 10 is processed. Therefore, in the present embodiment, members on the flexible substrate 110 are not readily damaged during the peeling process of the first area 102 from the carrier 20, such that the production yield of the flexible device 100 may be increased.

Figure 4A:
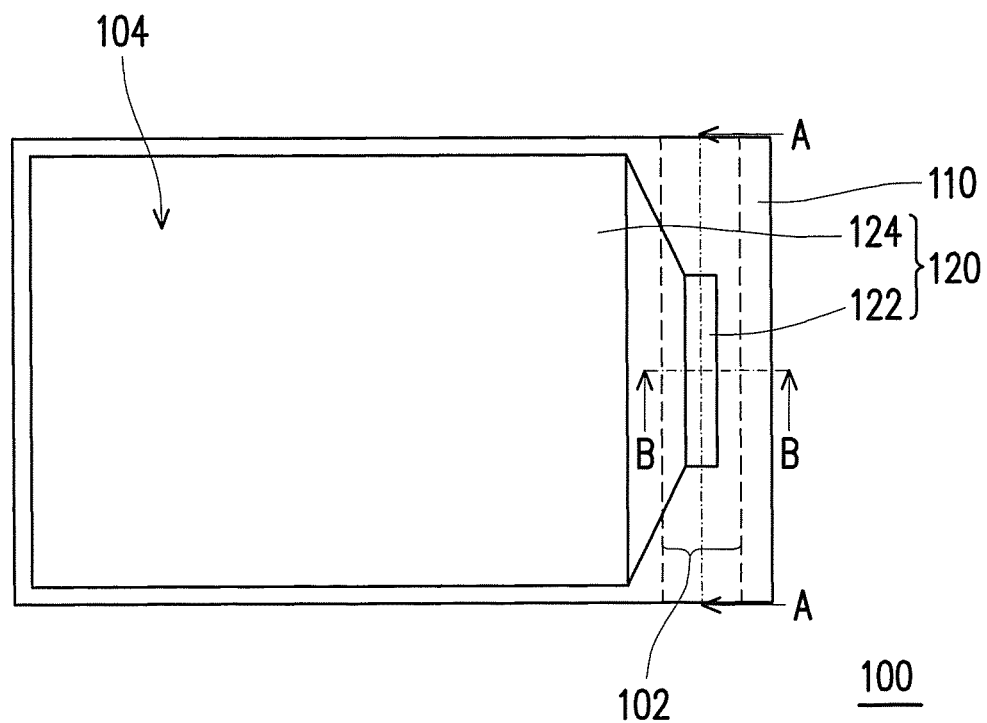
FIG. 4A is a top view of a flexible device of the first embodiment of the disclosure.
Figure 4B:
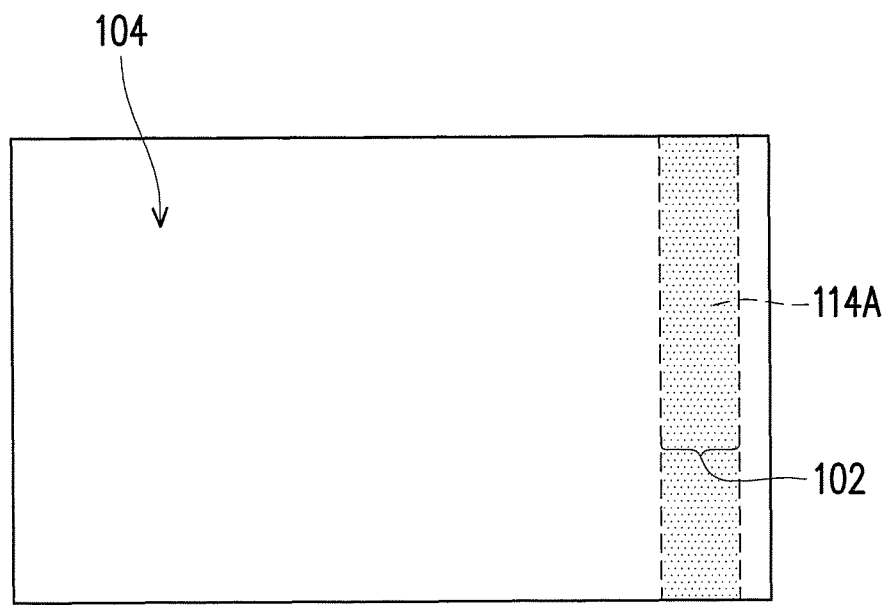
FIG. 4B is a top view of a flexible device of the first embodiment of the disclosure.
Figure 4C:
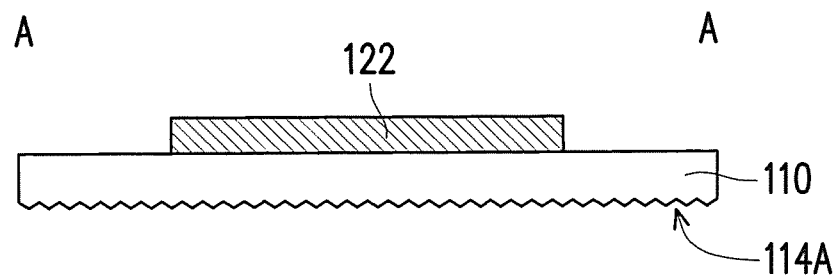
FIG. 4C is a cross-sectional view along line A-A of FIG. 4A.
Figure 4D:
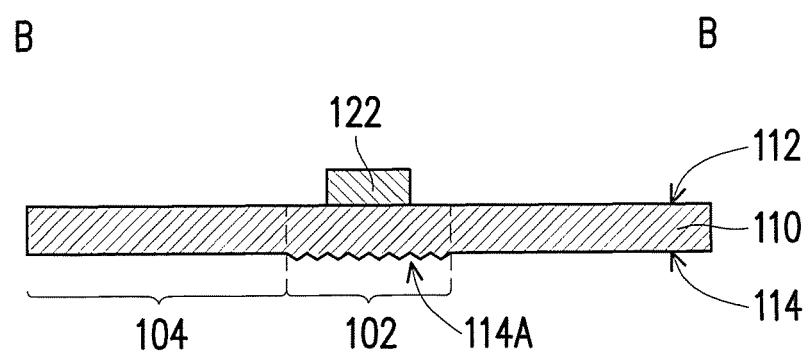
FIG. 4D is a cross-sectional view along line B-B of FIG. 4A.

FIG. 4A is a top view of a flexible device of the first embodiment of the disclosure, FIG. 4B is a top view of a flexible device of the first embodiment of the disclosure, FIG. 4C is a cross-sectional view along line A-A of FIG. 4A, and FIG. 4D is a cross-sectional view along line B-B of FIG. 4A. Referring to FIG. 4A to FIG. 4D at the same time, the flexible device 100 fabricated via the above steps has a first area 102 and a second area 104, wherein the stiffness of the first area 102 is greater than the stiffness of the second area 104. Moreover, the flexible device 100 may include a flexible substrate 110 and an element 120 disposed on the flexible substrate 110, wherein the element 120 may include a rigid element 122 and a functional element 124. The flexible substrate 110 includes a first surface 112 and a second surface 114 opposite to each other. Moreover, the rigid element 122 is disposed on the first surface 112 of the flexible substrate 110 and located in the first area 102, wherein the stiffness of the rigid element 122 is greater than the stiffness of the flexible substrate 110 and a projection area of a coarse structure 114A on the flexible substrate 110 overlaps the rigid element 122.

It may be known from FIG. 4B to FIG. 4D that, the second surface 114 of the flexible substrate 110 has a coarse structure 114A in the first area 102, such that the surface roughness of the second surface 114 in the first area 102 is greater than the surface roughness of the second surface 114 in the second area 104. The coarse structure 114A may be formed by, for instance, the laser irradiation step of FIG. 2A to FIG. 2C. According to the above steps, the laser irradiation step is performed in the first area 102, and therefore the coarse structure 114A also falls in the first area 102. The laser irradiation step is performed to reduce the adhesion of the release layer 10 where the rigid element 122 is located, and therefore the irradiation range of the laser beam overlaps the disposition area of the rigid element 122. Moreover, in the present embodiment, the flexible device 100 further includes a functional element 124 disposed in the second area 104, and the stiffness of the rigid element 122 is greater than the stiffness of the functional element 124, but in other embodiments, the functional element 124 may also be optionally omitted. In other words, the flexible device 100 may include only the flexible substrate 110 and the rigid element 122.

Figure 5:
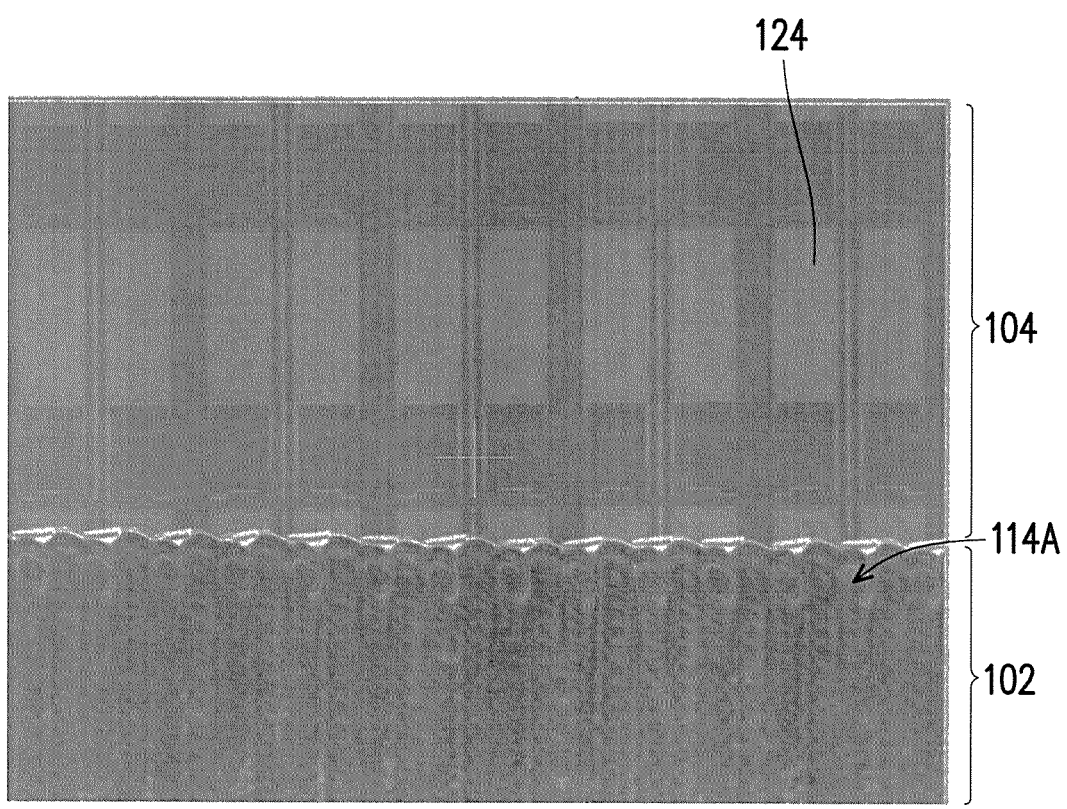
FIG. 5 is a micrograph of a second surface of a flexible substrate of the first embodiment of the disclosure.

FIG. 5 is a micrograph of a second surface of a flexible substrate of the first embodiment of the disclosure. It may be known from FIG. 5 that, the second surface 114 has a coarse structure 114A in the first area 102, and the second surface 114 appears smooth or translucent in the second area 104, such that the functional element 124 used as a display element is observed. Here, the functional element 124 used as a display element is exemplified by an organic light-emitting display pixel, but is not limited thereto.

It may be known from the first embodiment that, in the laser irradiation step, the release layer material is decomposed to reduce the adhesion of the release layer 10 in the first area 102, thus increasing the production yield of the flexible device 100. However, in the case that the decomposition of the release layer material generates gas, if the gas generated in the process may not be released or is excessively accumulated, deformation to the first area 102 may readily occur due to the pressure generated by the gas. Therefore, in the first embodiment, as shown in FIG. 2B, the irradiation path of the laser beam L starts from the first side S1 of the flexible substrate 110 and travels toward the second side S2 of the flexible substrate 110, and the first side S1 and the second side S2 are opposite sides. However, the fabrication method of the flexible device 100 is not limited thereto.

Figure 6A:
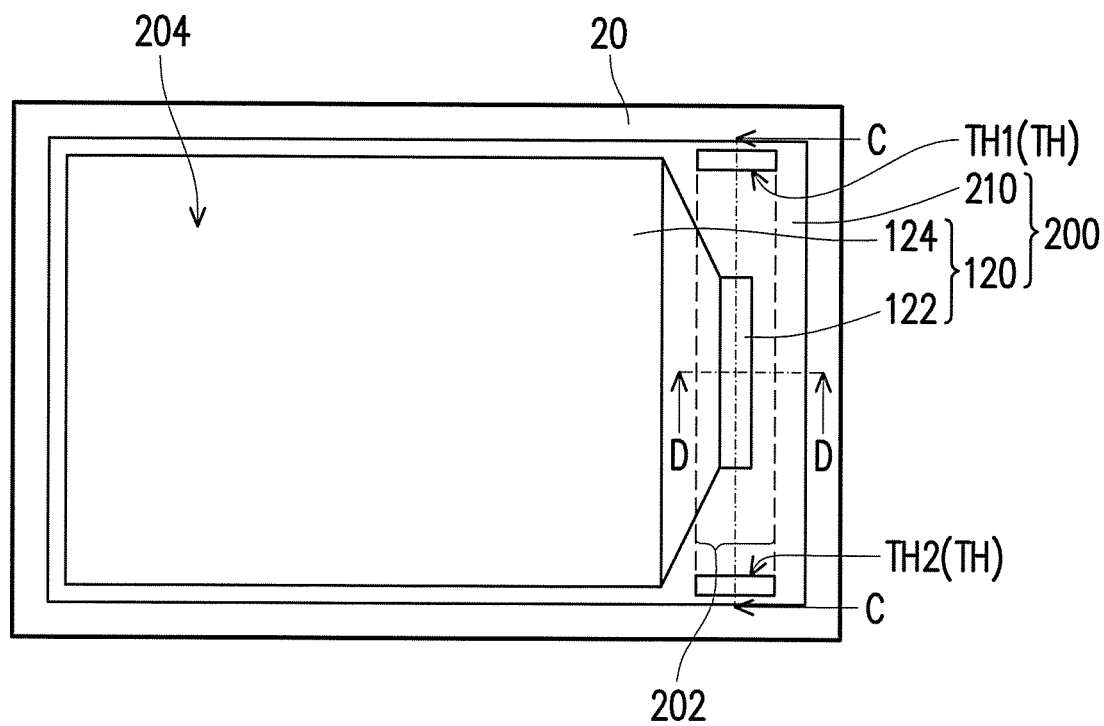
FIG. 6A is a top view of a step of a fabrication method of a flexible device of the second embodiment of the disclosure.
Figure 6B:
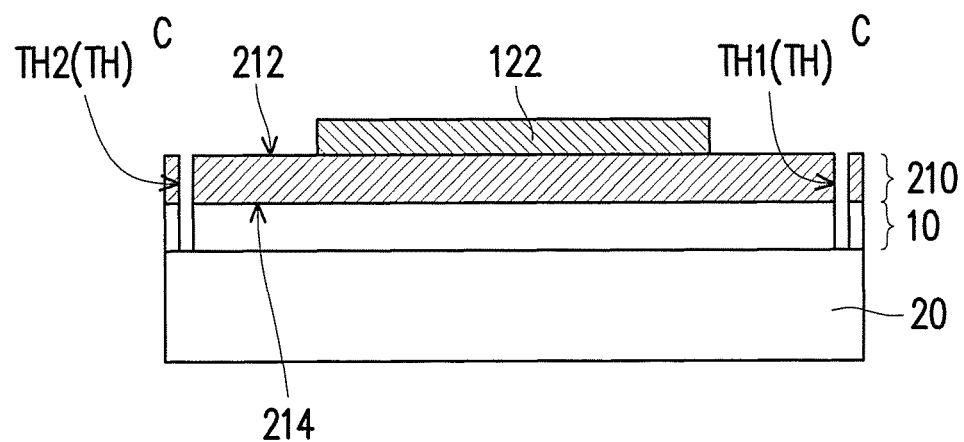
FIG. 6B is a cross-sectional view along line C-C of FIG. 6A.
Figure 6C:
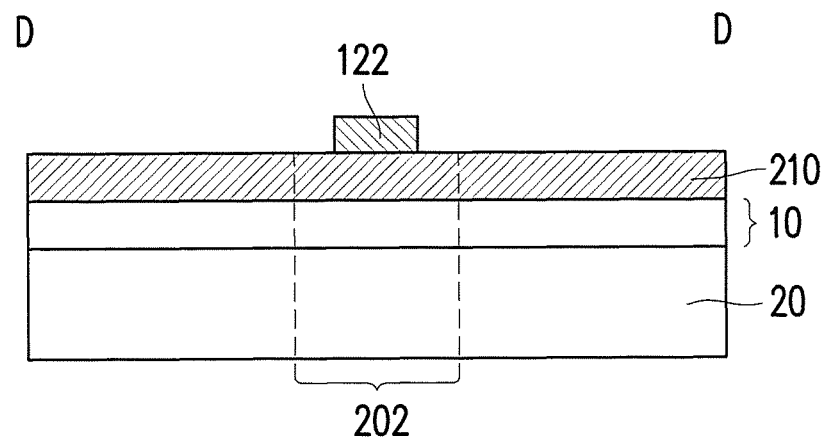
FIG. 6C is a cross-sectional view along line D-D of FIG. 6A.

FIG. 6A is a top view of a step of a fabrication method of a flexible device of the second embodiment of the disclosure, FIG. 6B is a cross-sectional view along line C-C of FIG. 6A, and FIG. 6C is a cross-sectional view along line D-D of FIG. 6A. In the present embodiment, the flexible substrate 110 may be temporarily adhered on the carrier 20 via the release layer 10 according to the steps of FIG. 1A to FIG. 3A, and the element 120 is fabricated on the flexible substrate 110 when the flexible substrate 110 is adhered on the carrier 20. Then, referring to FIG. 6A to FIG. 6C, a processing step is performed to fabricate at least one via TH on the flexible substrate 110 to form a flexible substrate 210. The processing step of forming the via TH may be, for instance, cutting with a round blade, laser cutting, or punching, but is not limited thereto. Here, the number of the vias TH (via TH1 and via TH2) is two, but this is only exemplary. In other embodiments, the number of the vias TH may be one or more than two.

In the present embodiment, the rigid element 122 is located between the via TH1 and the via TH2, and the via TH1 and the via TH2 respectively define two ends of a first area 202. Therefore, the area outside of the first area 202 may be regarded as a second area 204. The entire rigid element 122 falls within the first area 202. Moreover, the via TH1 and the via TH2 may pass through the flexible substrate 210 to expose the release layer 10, or pass through the flexible substrate 210 and the release layer 10 at the same time and expose the carrier 20, and the latter is exemplified in the following figures.

Figure 7A:
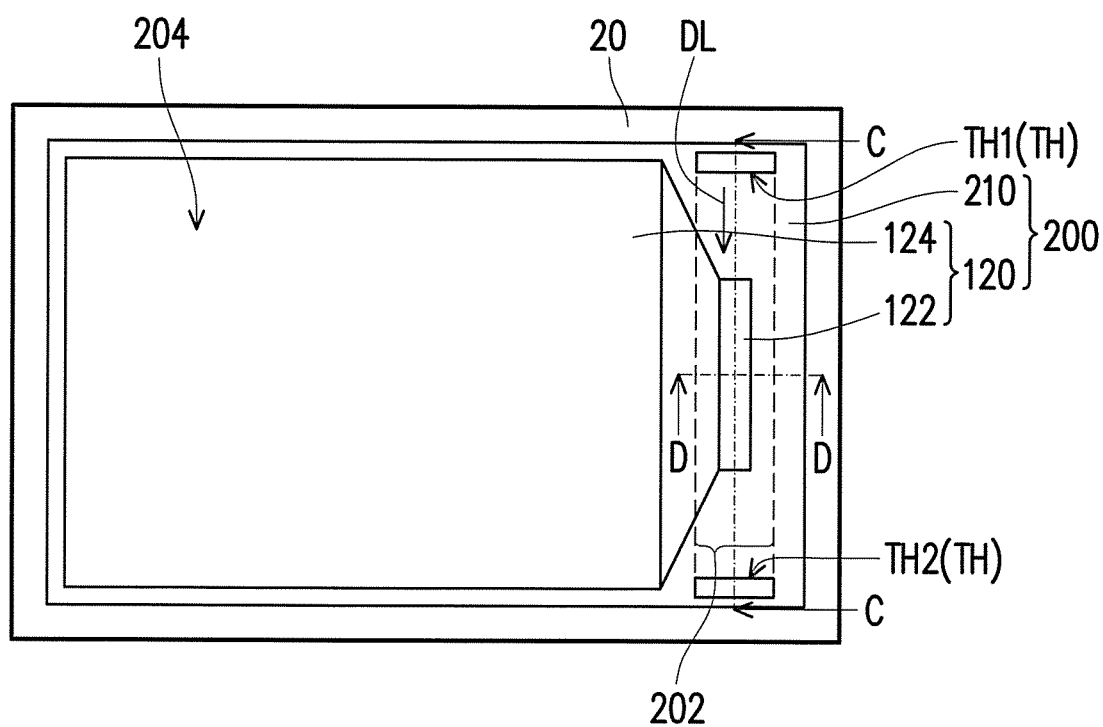
FIG. 7A is a top view of a step of a fabrication method of a flexible device of the second embodiment of the disclosure.
Figure 7B:
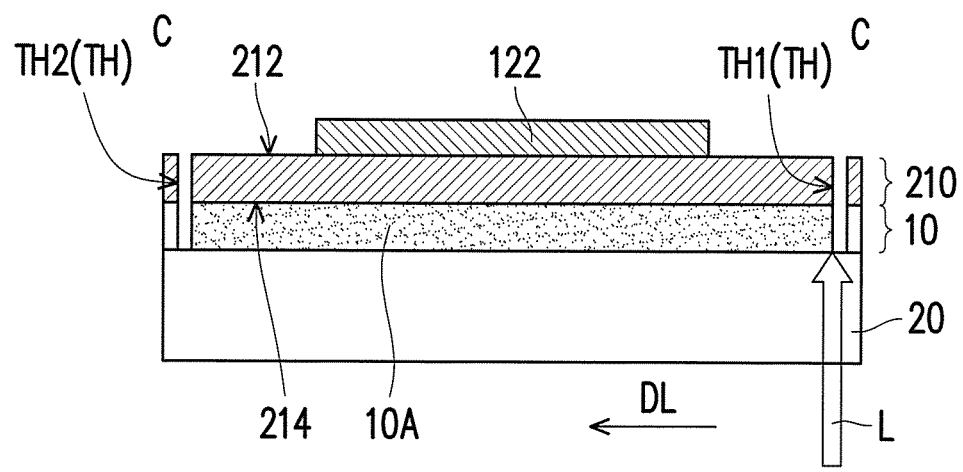
FIG. 7B is a cross-sectional view along line C-C of FIG. 7A.
Figure 7C:
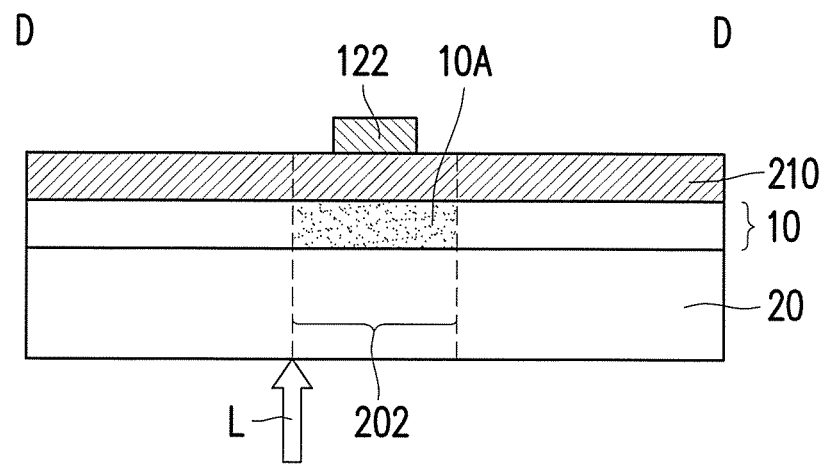
FIG. 7C is a cross-sectional view along line D-D of FIG. 7A.

FIG. 7A is a top view of a step of a fabrication method of a flexible device of the second embodiment of the disclosure, FIG. 7B is a cross-sectional view along line C-C of FIG. 7A, and FIG. 7C is a cross-sectional view along line D-D of FIG. 7A. The steps represented in FIG. 7A to FIG. 7C include, for instance, irradiating a laser beam L from one side of the carrier 20 toward the release layer 10 located in the first area 202 to form a release layer 10A in the first area 202. In the present embodiment, the irradiation path of the laser beam L starts at the location of the first via TH1 and ends at the location of the second via TH2. In other words, the laser beam L moves along a moving direction DL.

Figure 7D:
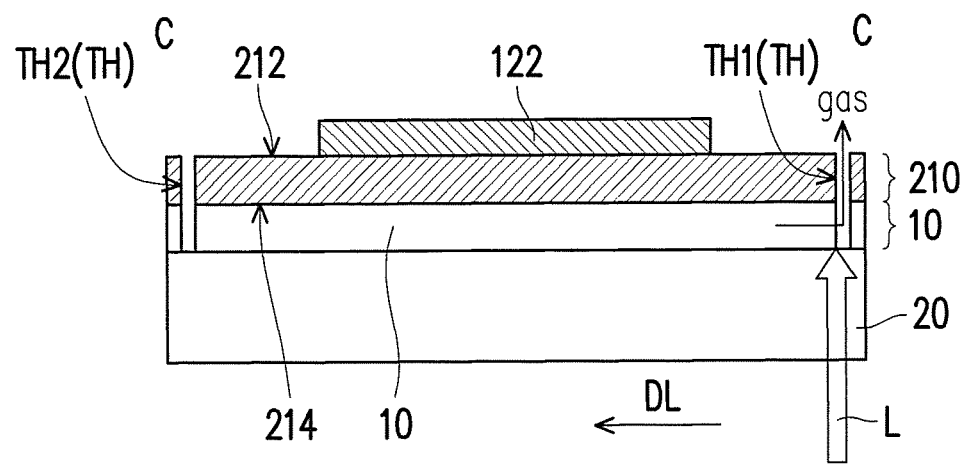
FIG. 7D to FIG. 7F are the irradiation process of a laser beam L along an irradiation path.
Figure 7E:
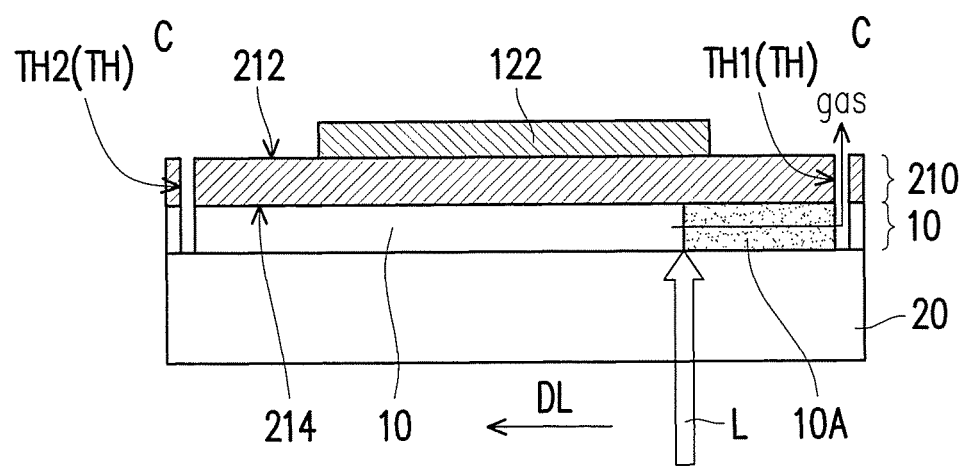
Figure 7F:
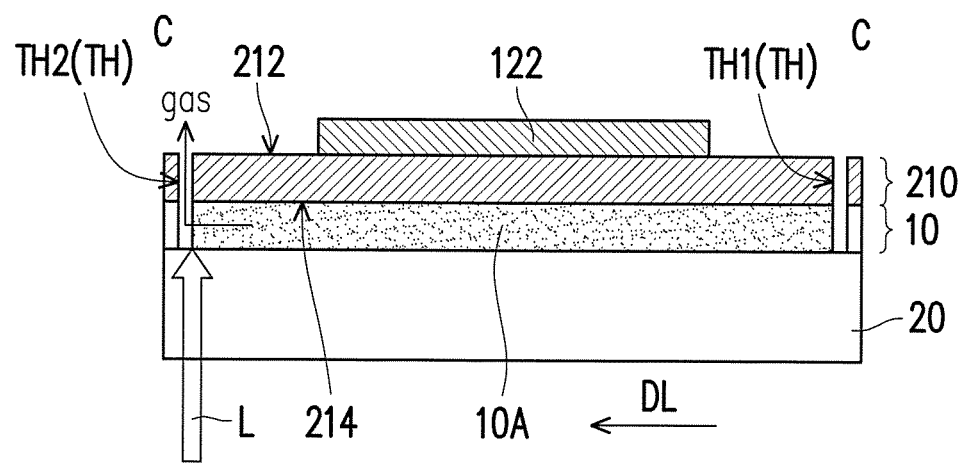

FIG. 7D to FIG. 7F are the irradiation process of a laser beam L along an irradiation path. It may be known from FIG. 7D to FIG. 7F that, since the irradiation path of the laser beam L starts at the location of the first via TH1 and travels toward the second via TH2, when the material of the release layer 10 is decomposed by laser energy, the generated gas may be dissipated from the first via TH1 (as shown in FIG. 7D and FIG. 7E). Moreover, when the irradiation point of the laser beam L is close to the second via TH2, the generated gas may be dissipated from the second via TH2 and the first via TH1. Therefore, accumulation of gas does not readily occur at the location of the release layer 10A, such that the flexible substrate 210 is not deformed or the flexible device 200 is not damaged. In other words, the via TH1 may facilitate the dissipation of gas generated in the fabrication process, thus facilitating increase in production yield.

Figure 8A:
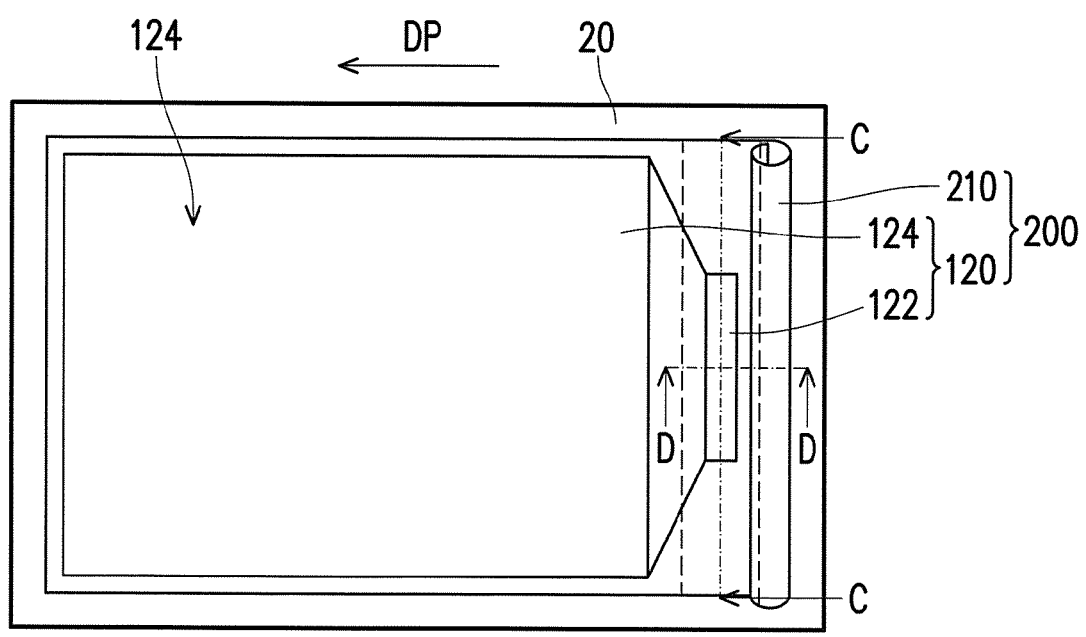
FIG. 8A is a top view of a step of a fabrication method of a flexible device of the second embodiment of the disclosure.
Figure 8B:
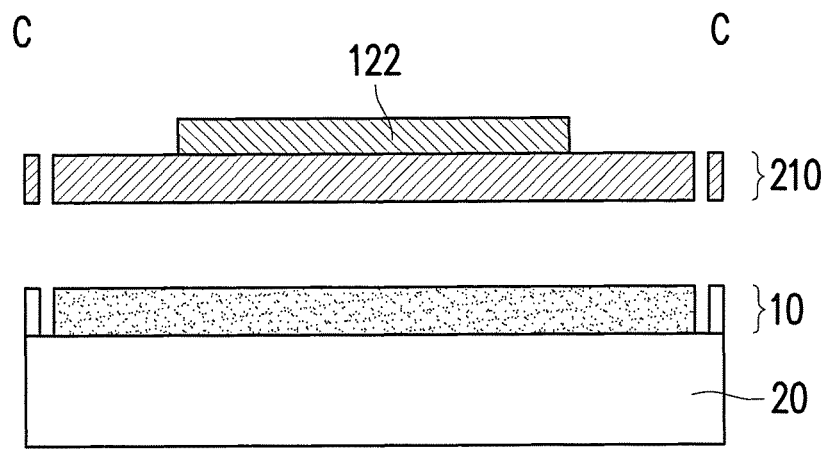
FIG. 8B is a cross-sectional view along line C-C of FIG. 8A.
Figure 8C:
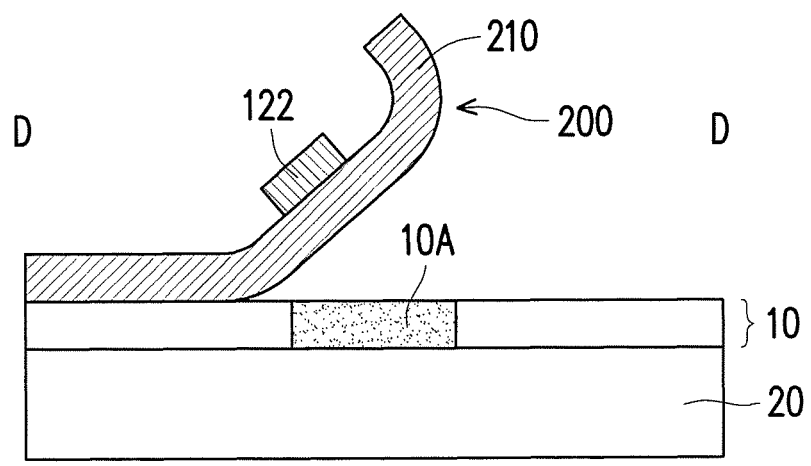
FIG. 8C is a cross-sectional view along line D-D of FIG. 8A.

FIG. 8A is a top view of a step of a fabrication method of a flexible device of the second embodiment of the disclosure, FIG. 8B is a cross-sectional view along line C-C of FIG. 8A, and FIG. 8C is a cross-sectional view along line D-D of FIG. 8A. The steps represented by FIG. 8A to FIG. 8C are similar to the steps of FIG. 3A to FIG. 3C, which include the removal of the flexible device 200 from the carrier 20. Specific steps of FIG. 8A to FIG. 8C are as described for FIG. 3A to FIG. 3C. In the first embodiment and the second embodiment, the flexible substrate 110 or 210 is separated from the carrier 20 along the peeling direction DP, that is, the flexible substrate 110 or 210 is separated from the carrier 20 from the side of the flexible substrate 110 or 210 closer to the rigid element 122 toward the opposite side. However, the peeling direction DP is not limited to the direction represented in the figure. In other embodiments, the flexible substrate 110 or 210 may also be separated from the carrier 20 along a direction opposite to the peeling direction DP, that is, the flexible substrate 110 or 210 may be separated from the carrier 20 from the side of the flexible substrate 110 or 210 farther from the rigid element 122 toward the opposite side.

Figure 9A:
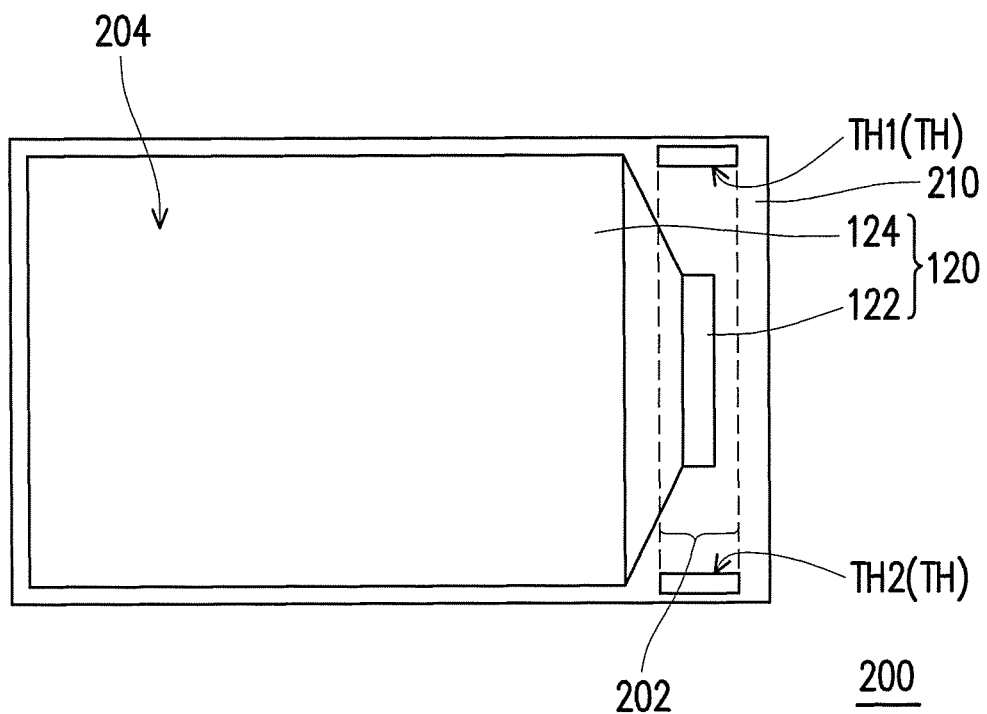
FIG. 9A is a top view of a flexible device of the second embodiment of the disclosure.
Figure 9B:
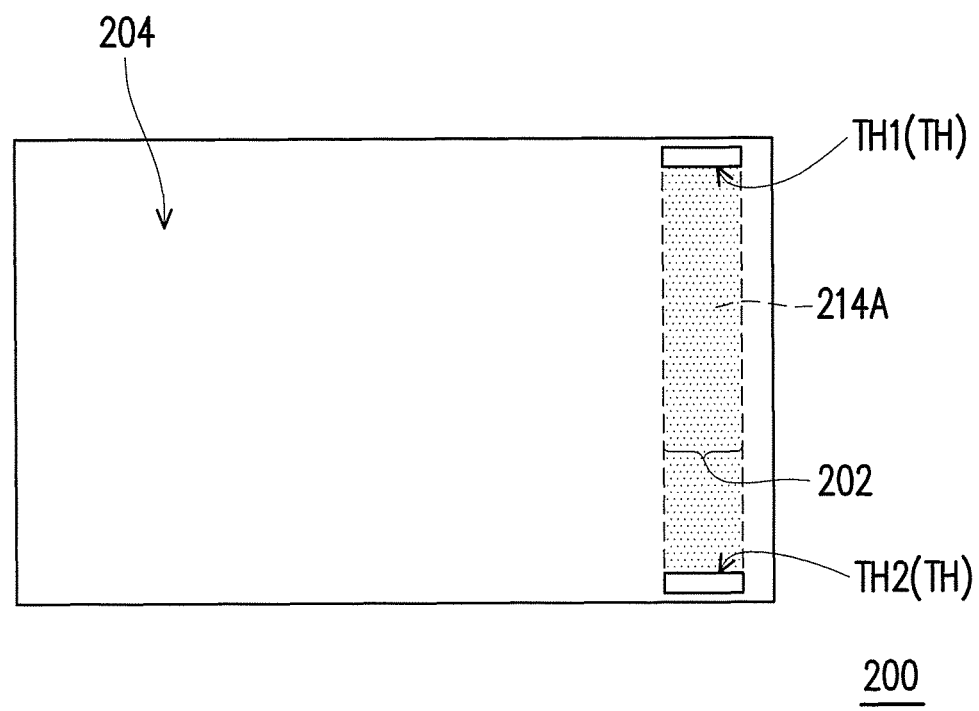
FIG. 9B is a top view of a flexible device of the second embodiment of the disclosure.

FIG. 9A is a top view of a flexible device of the second embodiment of the disclosure, and FIG. 9B is a top view of a flexible device of the second embodiment of the disclosure. Referring to FIG. 9A and FIG. 9B, the flexible device 200 fabricated according to steps such as FIG. 6A to FIG. 8A may be substantially similar to the flexible device 100 of the first embodiment. The flexible device 200 has a first area 202 and a second area 204, wherein the stiffness of the first area 202 may be greater than the stiffness of the second area 204.

Moreover, the flexible device 200 includes a flexible substrate 210 and an element 120 disposed on the flexible substrate 210, wherein the element 120 may include a rigid element 122 and a functional element 124. The flexible substrate 210 includes a first surface 212 (shown in FIG. 6B) and a second surface 214 (shown in FIG. 6B) opposite to each other, and has vias TH1 and TH2. Moreover, the rigid element 122 is disposed on the first surface 212 of the flexible substrate 210 and located in the first area 202, wherein the stiffness of the rigid element 122 may be greater than the stiffness of the flexible substrate 210. Moreover, the second surface 214 of the flexible substrate 210 has a coarse structure 214A in the first area 202 and a projection area of the coarse structure 214A on the flexible substrate 210 overlaps the area of the rigid element 122. In other words, the flexible substrate 210 has two vias TH1 and TH2. However, in other embodiments, the flexible substrate 210 may also only include one via TH, or more than two vias TH.

Figure 10A:
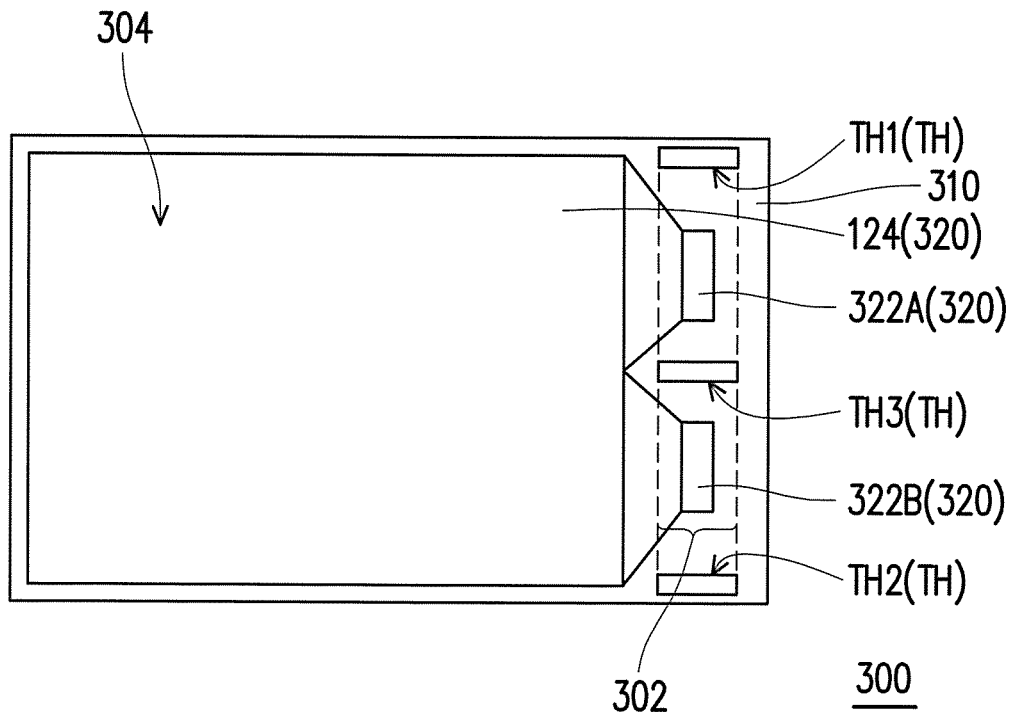
FIG. 10A is a top view of a flexible device of the third embodiment of the disclosure.
Figure 10B:
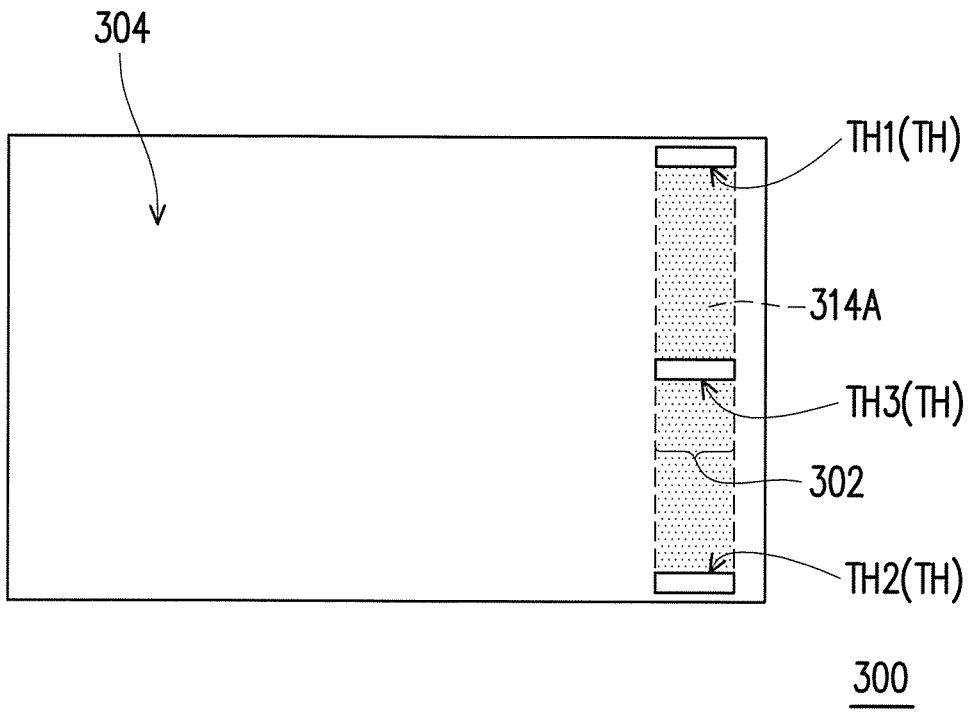
FIG. 10B is a top view of a flexible device of the third embodiment of the disclosure.

For instance, FIG. 10A is a top view of a flexible device of the third embodiment of the disclosure, and FIG. 10B is a top view of a flexible device of the third embodiment of the disclosure. Referring to FIG. 10A and FIG. 10B, a flexible device 300 may be substantially similar to the flexible device 100 of the first embodiment. The flexible device 300 has a first area 302 and a second area 304, wherein the stiffness of the first area 302 may be greater than the stiffness of the second area 304. Moreover, the flexible device 300 includes a flexible substrate 310 and an element 320 disposed on the flexible substrate 310, wherein the element 320 may include rigid elements 322A and 322B and a functional element 124. The flexible substrate 310 includes a first surface (first surface represented in FIG. 10A) and a second surface (second surface represented in FIG. 10B) opposite to each other, and has vias TH1, TH2, and TH3. Moreover, the rigid elements 322A and 322B are disposed on the first surface of the flexible substrate 310 and located in the first area 302, wherein the stiffness of each of the rigid elements 322A and 322B is greater than the stiffness of the flexible substrate 310. Moreover, when the flexible device 300 is fabricated and when the release layer is, for instance, irradiated via laser, the via TH3 may be located in the irradiation path of the laser beam or the irradiation path of the laser beam may pass through the via TH3. As a result, the second surface of the flexible substrate 310 has a coarse structure 314A in the first area 302, and a projection area of the coarse structure 314A on the flexible substrate overlaps the rigid elements 322A and 322B. In other words, the flexible substrate 310 has three vias TH1, TH2, and TH3, and the flexible substrate 310 has two rigid elements 322A and 322B. In the three vias TH1, TH2, and TH3, the vias TH1 and TH2 define two ends of the first area 302, and the via TH3 is located inside the first area 302. The rigid element 322A is located between the via TH1 and the via TH3, and the rigid element 322B is located between the via TH2 and the via TH3. Moreover, the rigid elements 322A and 322B may be packaged driving chips, but are not limited thereto.

Figure 11A:
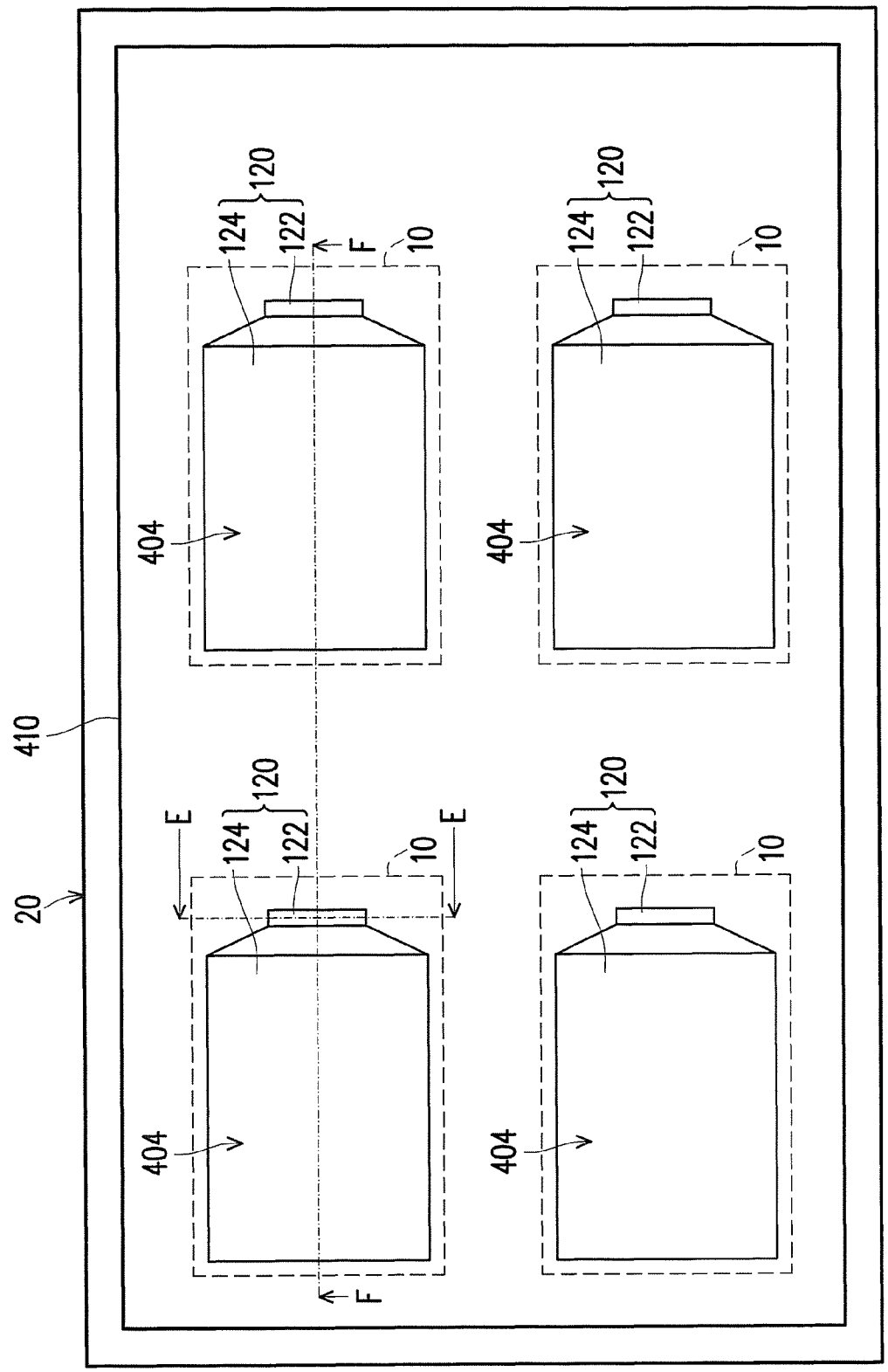
FIG. 11A is a top view of a step of a fabrication method of a flexible device of the fourth embodiment of the disclosure.
Figure 11B:
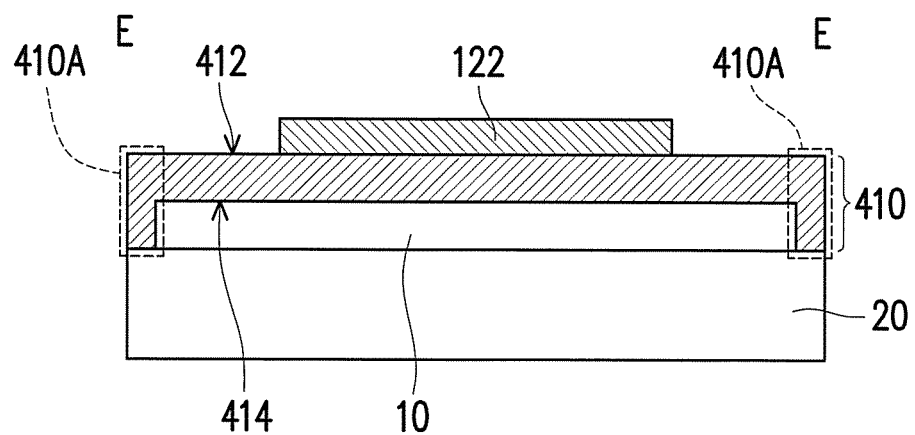
FIG. 11B is a cross-sectional view along line E-E of FIG. 11A.
Figure 11C:
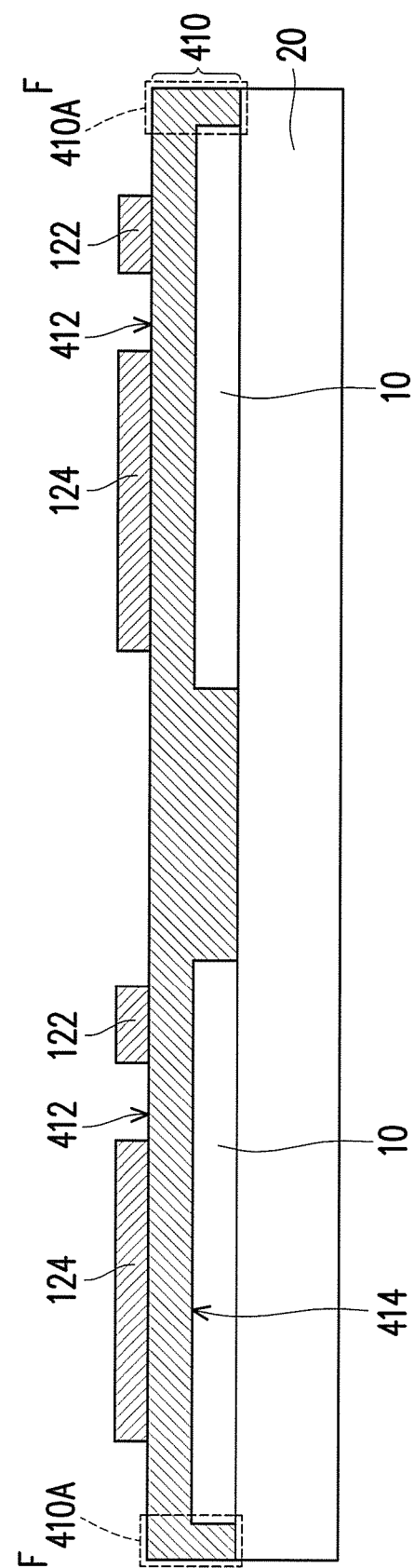
FIG. 11C is a cross-sectional view along line F-F of FIG. 11A.

FIG. 11A is a top view of a step of a fabrication method of a flexible device of the fourth embodiment of the disclosure, FIG. 11B is a cross-sectional view along line E-E of FIG. 11A, and FIG. 11C is a cross-sectional view along line F-F of FIG. 11A. Referring to FIG. 11A to FIG. 11C at the same time, the present step includes temporarily adhering a flexible substrate 410 on a carrier 20 via a release layer 10, wherein the area of the release layer 10 is less than the flexible substrate 410 such that the flexible substrate 410 is partially in contact with the carrier 20. Here, a portion 410A of the carrier 20 in contact with the flexible substrate 410 surrounds the release layer 10. The flexible substrate 410 has a first surface 412 and a second surface 414, and a portion of the second surface 414 is in contact with the release layer 10. Moreover, in the present step, at least one element 120 is also formed on the first surface 412 of the flexible substrate 410. Here, the fabrication method of the flexible substrate 410 is the same as the fabrication method of the flexible substrate 110 of FIG. 1A to FIG. 1C, and the fabrication, the type, and the location . . . etc. of the elements 120 are also as described in the first embodiment.

Figure 12A:
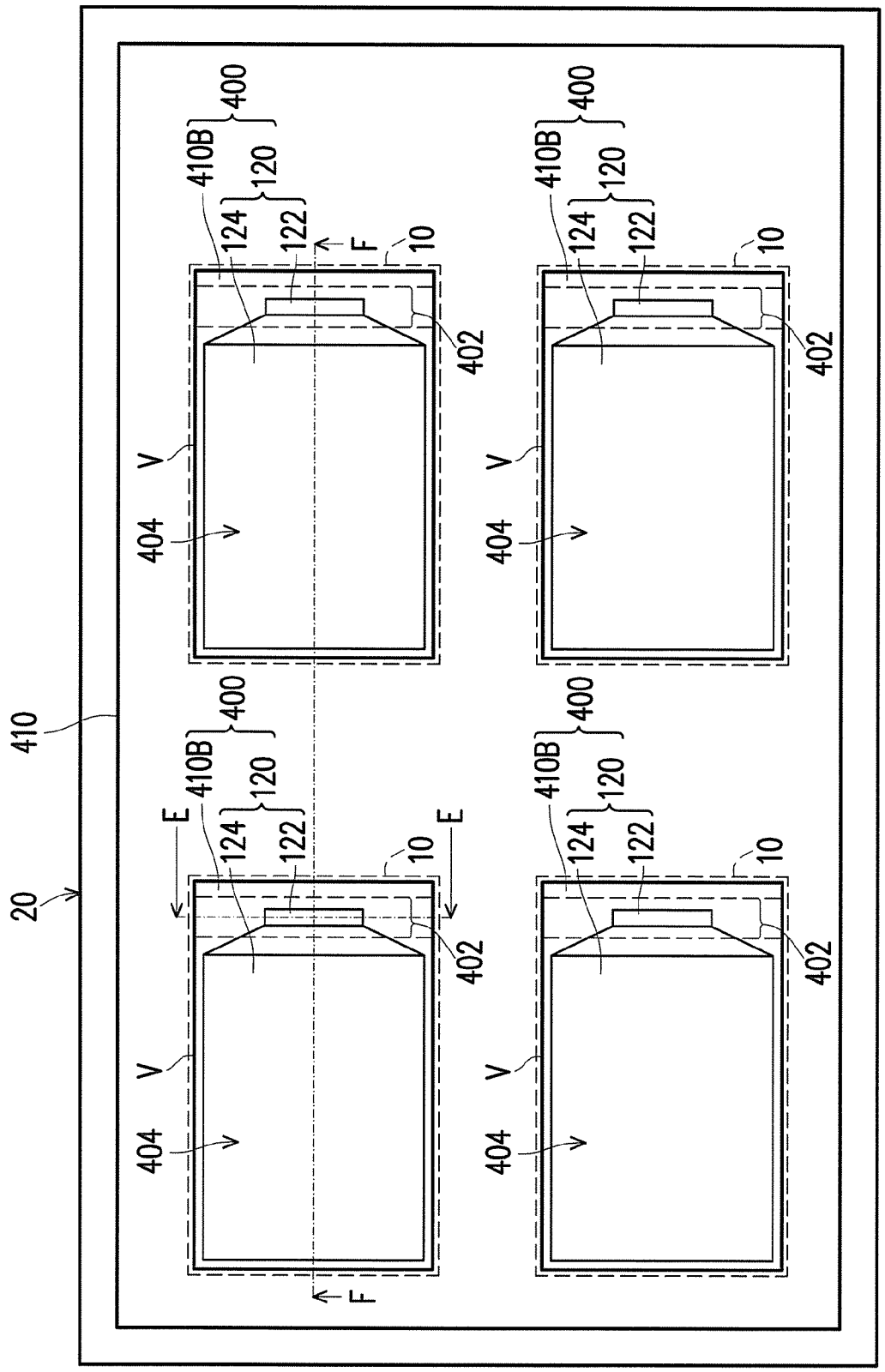
FIG. 12A is a top view of a step of a fabrication method of a flexible device of the fourth embodiment of the disclosure.
Figure 12B:
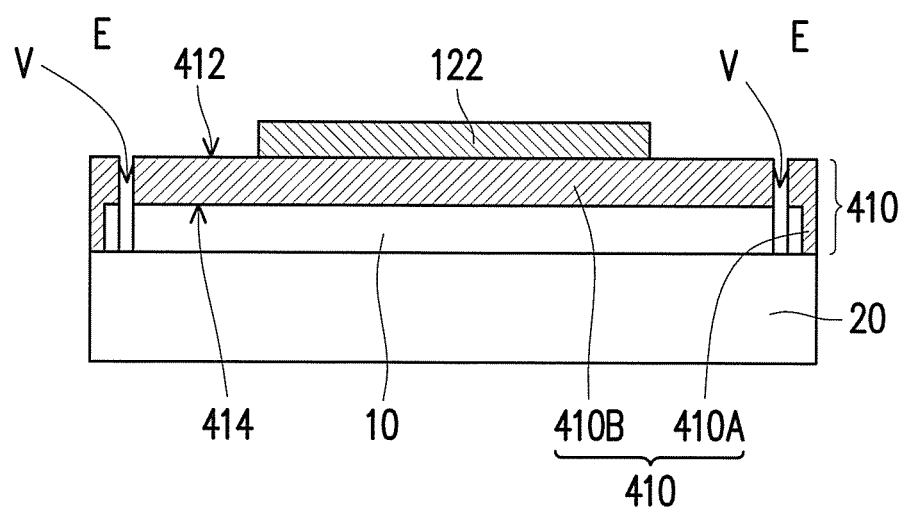
FIG. 12B is a cross-sectional view along line E-E of FIG. 12A.
Figure 12C:
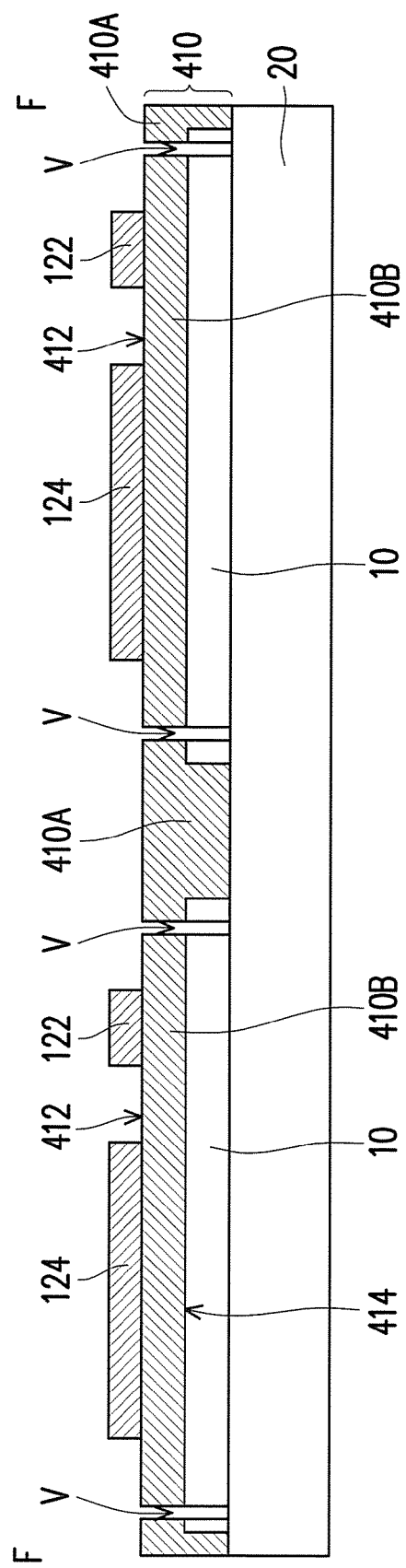
FIG. 12C is a cross-sectional view along line F-F of FIG. 12A.

FIG. 12A is a top view of a step of a fabrication method of a flexible device of the fourth embodiment of the disclosure, FIG. 12B is a cross-sectional view along line E-E of FIG. 12A, and FIG. 12C is a cross-sectional view along line F-F of FIG. 12A. Referring to FIG. 12A to FIG. 12C, a processing step is performed to cut the flexible substrate 410 along the periphery of the release layer 10 so as to form a circular cut opening V as shown in FIG. 12A, and the cut opening V exposes the release layer 10, or the cut opening V passes through the flexible substrate 410 and the release layer 10 at the same time and exposes the carrier 20 (FIG. 12B). Here, the flexible substrate 410 is cut into two portions separate from each other, one of the portions is a flexible substrate 410B to be removed and the other portion is the portion 410A in contact with the carrier 20. Moreover, in the present embodiment, the elements 120 are all fabricated on the flexible substrate 410B to form a flexible device 400.

In the present embodiment, the elements 120 include a rigid element 122 and a functional element 124, wherein the stiffness of the rigid element 122 may be greater than that of the functional element 124 and also greater than that of the flexible substrate 410B. Therefore, the flexible device 400 may have a first area 402 and a second area 404, and the rigid element 122 is located in the first area 402 such that the stiffness of the first area 402 is greater than that of the second area 404.

Figure 13A:
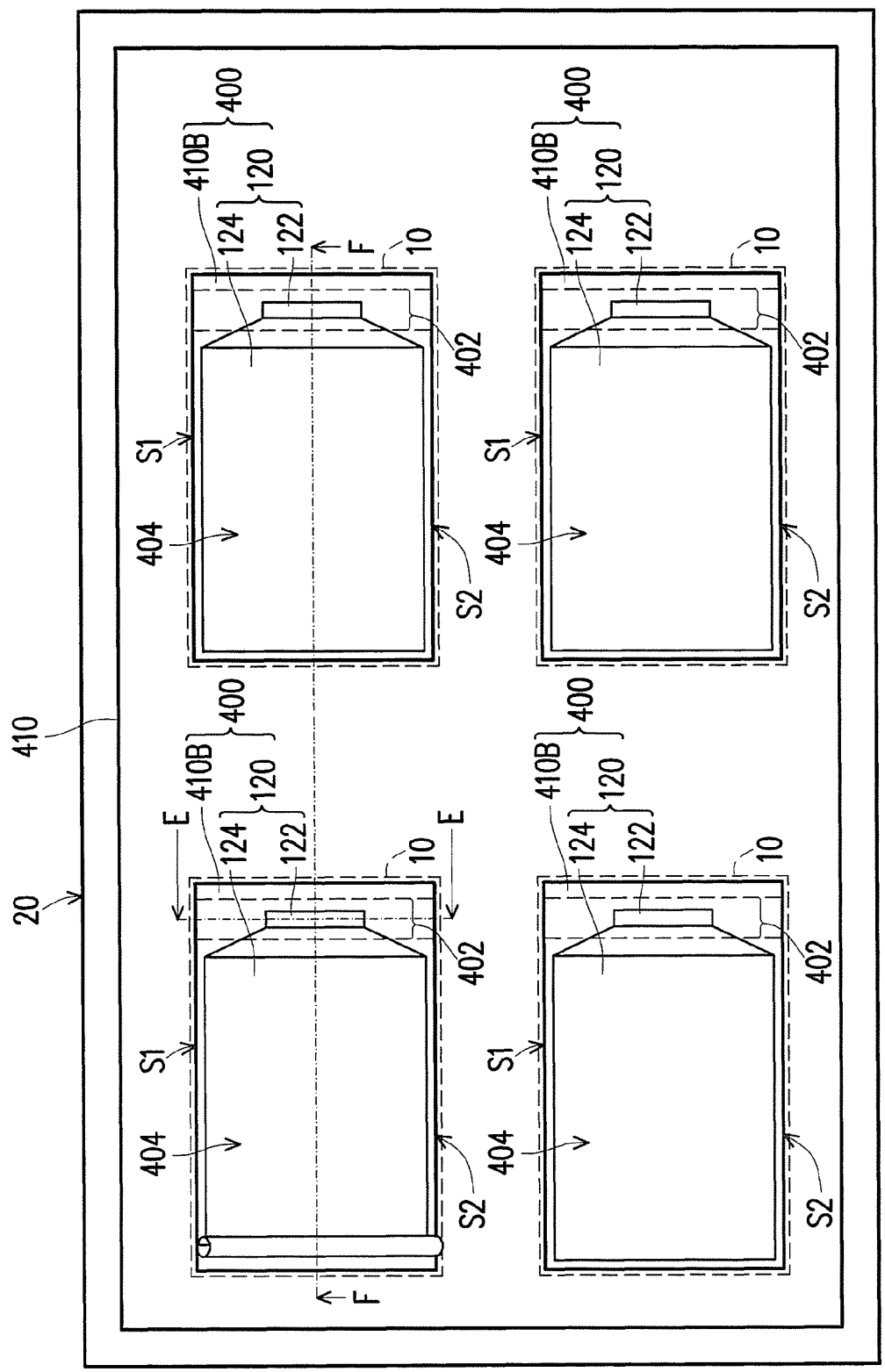
FIG. 13A is a top view of a step of a fabrication method of a flexible device of the fourth embodiment of the disclosure.
Figure 13B:
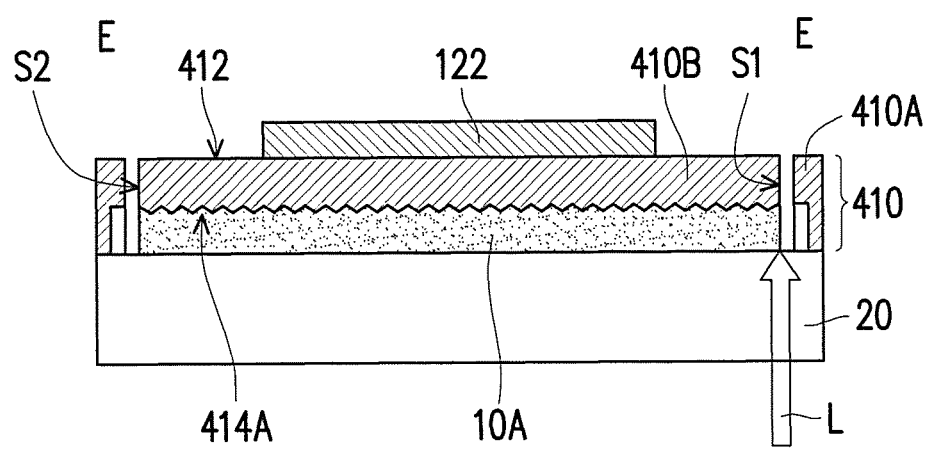
FIG. 13B is a cross-sectional view along line E-E of FIG. 13A.
Figure 13C:
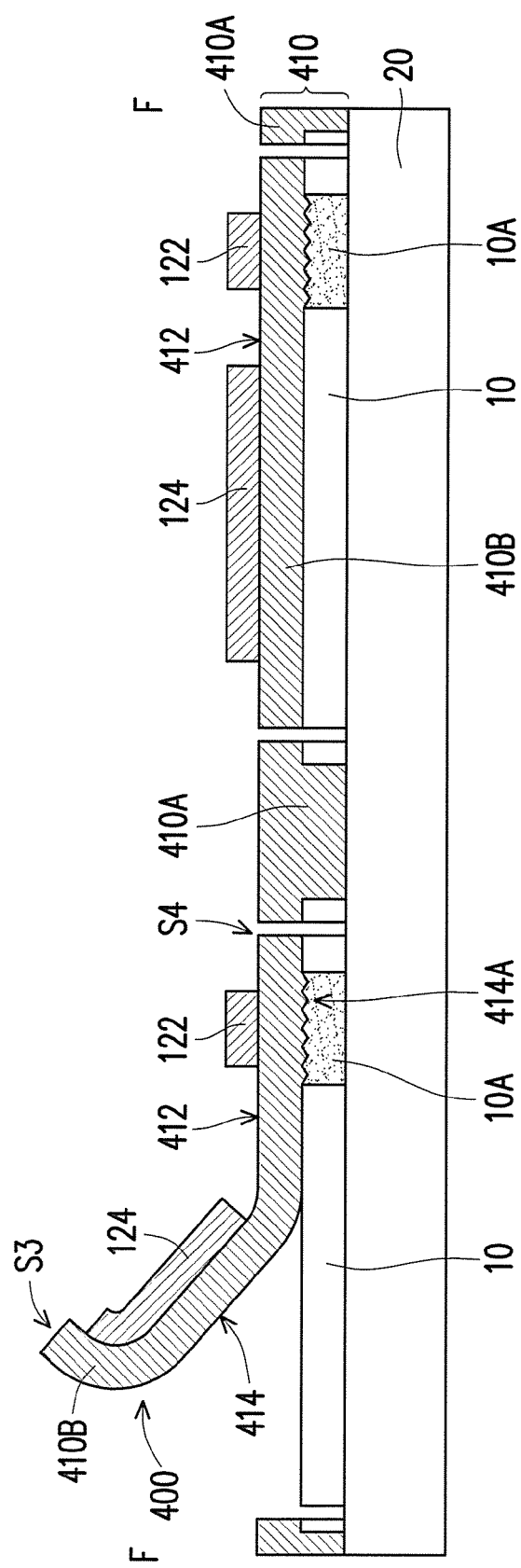
FIG. 13C is a cross-sectional view along line F-F of FIG. 13A.

FIG. 13A is a top view of a step of a fabrication method of a flexible device of the fourth embodiment of the disclosure, FIG. 13B is a cross-sectional view along line E-E of FIG. 13A, and FIG. 13C is a cross-sectional view along line F-F of FIG. 13A. Referring to FIG. 13A to FIG. 13C, the flexible device 400 is removed from the carrier 20, such as irradiating from one side of the carrier 20 toward the release layer 10 located in the first area 402 via a laser beam L so as to form a release layer 10A in the first area 402. In the present embodiment, since the edge of the flexible substrate 410B is exposed by the cut opening V, the irradiation path of the laser beam L starts from the first side S1 of the flexible substrate 410 and travels toward the second side S2 of the flexible substrate 410, and the first side S1 and the second side S2 are opposite sides. Moreover, the peeling direction of the removal of the flexible device 400 from the carrier 20 may be the same as FIG. 13C in that peel force is applied from a third side S3 of the flexible substrate 410B toward a fourth side S4 of the flexible substrate 410B, or the peel force is applied from the fourth side S4 of the flexible substrate 410B toward the third side S3 of the flexible substrate 410B. Here, the third side S3 is farther from the rigid element 122 and the fourth side S4 is closer to the rigid element 122. Therefore, when peeling the flexible device 400 from the carrier 20 via the method of FIG. 13C, the peeling step and the laser irradiation step may be performed at the same time, but the disclosure is not limited thereto. In other embodiments, the laser irradiation step may be before the peeling step. Moreover, similar to the above embodiments, in the laser irradiation step, a coarse structure 414A is formed on the second surface 414 of the flexible substrate 410B, and the laser irradiation step is only performed in the first area 402, and therefore the coarse structure 414A is also only located in the first area 402.

In the above embodiments, the irradiation of the laser beam may decompose or modify the release layer material and thereby reduce the adhesion of the release layer in the irradiated area. However, heat accumulation phenomenon may occur to the periphery of the area irradiated by the laser beam. The heat accumulation phenomenon may cause the adhesion of the release layer material to increase and is not good for the peeling step. Therefore, the irradiation method of a laser beam may be adjusted accordingly.

The irradiation method of a laser beam is described in the following based on the step of FIG. 2A.

FIG. 14 is an embodiment of an irradiation method of a laser beam in the step of FIG. 2A. Referring to FIG. 14A, the members in the present figure are all as described for FIG. 2A and are not repeated herein. When the laser irradiation step is performed via a dot laser beam LB, the irradiation point LB of the laser beam travels, for instance, along a trajectory P1. Moreover, the area of each irradiation point LB of the laser beam partially overlaps the area of the previous irradiation point LB. The irradiation points LB of the laser beam cover the entire first area 102, and therefore the coarse structure generated based on laser irradiation in the above embodiments also covers the entire first area 102.

FIG. 15 shows a schematic of a laser irradiation point and a heat-affected zone under an irradiation method of FIG. 14. Referring to both FIG. 14 and FIG. 15, the irradiation point LB of each laser beam corresponds to a heat-affected zone HB, and the area of the heat-affected zone HB is greater than the area of the irradiation point LB. When two overlapping irradiation points LB, such as irradiation points LB1 and LB2 are irradiated in a consecutive manner, the heat-affecting effect of the corresponding heat-affected zones HB1 and HB2 may be increased. Therefore, the overlapping portion of the heat-affected zones HB1 and HB2, such as a heat-affected zone HBS, has the most heat-affecting effect. In other words, the adhesion of the release layer material in the heat-affected zone HBS may be more increased. Therefore, when the flexible substrate 110 is to be peeled from the carrier 20 along the peeling direction DP, the heat-affected zone HBS is preferably not densely arranged in a direction R perpendicular to the peeling direction DP, which causes difficult peeling. In the present embodiment, since the irradiation point LB of the laser beam travels along the trajectory P1, the heat-affected zone HBS is arranged to be substantially parallel to the peeling direction DP, so as to prevent difficulty in peeling.

Figure 16:
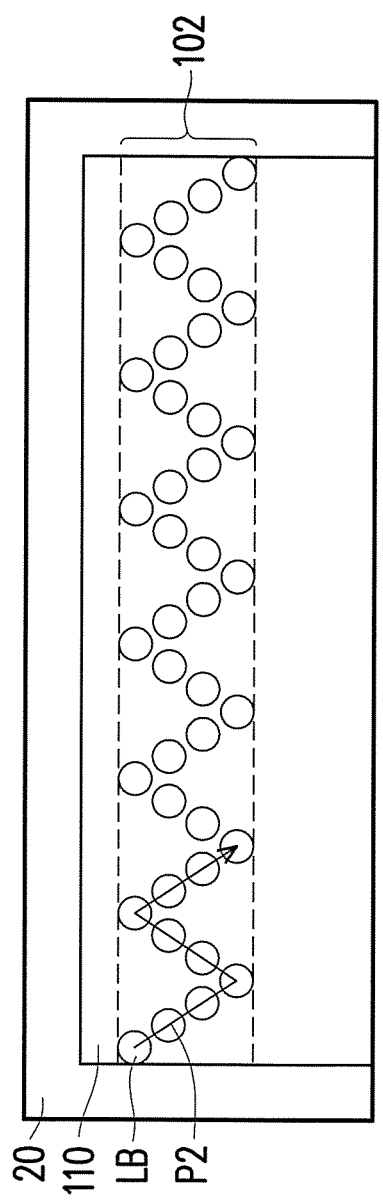
FIG. 16 and FIG. 17 are two other embodiments of the irradiation method of a laser beam in the step of FIG. 2A.
Figure 17:
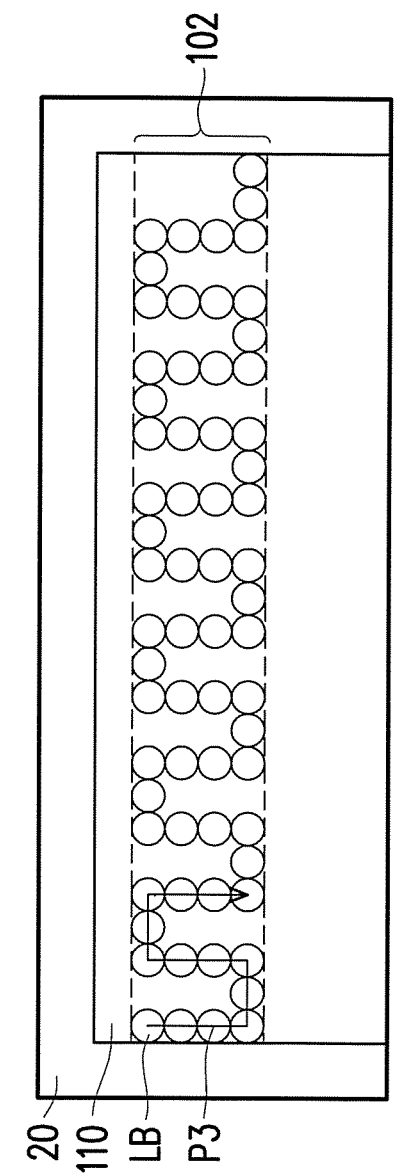

FIG. 16 and FIG. 17 are two other embodiments of the irradiation method of a laser beam in the step of FIG. 2A. In FIG. 16, the irradiation point LB of a laser beam travels, for instance, along a trajectory P2, and overlapping does not occur between irradiation points LB, wherein the trajectory P2 is substantially formed by the connection of a plurality of V-type paths. At this point, the irradiation points LB are distributed in a partial area of the first area 102, and therefore the coarse structure generated based on laser irradiation in the above embodiments is also distributed in a partial area of the first area 102. Moreover, in FIG. 17, overlapping may also not occur between the irradiation points LB, and the irradiation points LB of the laser beam travel along a trajectory P3, wherein the trajectory P3 may be similar to the trajectory P1 of FIG. 14 in that both are winding trajectories, but the trajectory P3 is more sparsely distributed and the trajectory P1 is more densely distributed.

Figure 18:
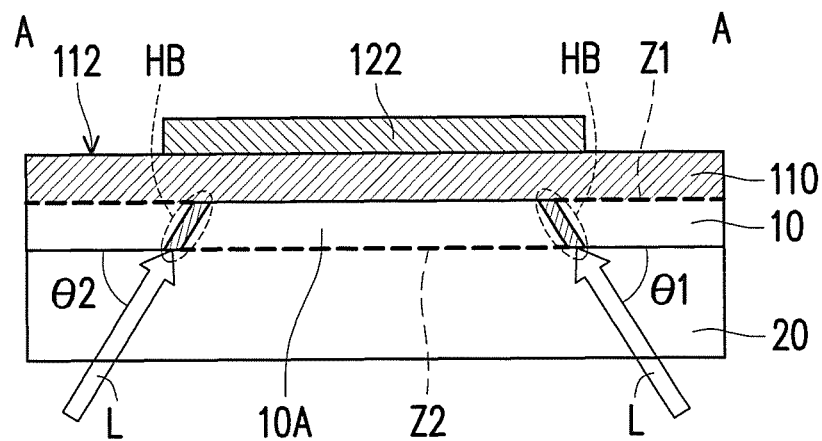
FIG. 18 and FIG. 19 are schematics of different embodiments of the laser irradiation step.
Figure 19:
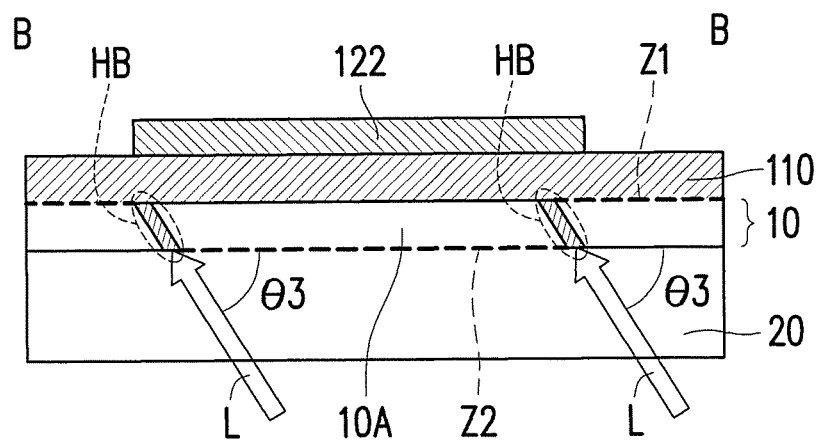

In addition to controlling the travel trajectory of the irradiation points, a negative effect to the peeling step by a heat-affected zone may also be reduced via the incident angle of the laser beam. For instance, FIG. 18 and FIG. 19 are schematics of different embodiments of the laser irradiation step. In FIG. 18 and FIG. 19, the irradiation direction of the laser beam L may be not perpendicular to the flexible substrate 110, and irradiation may be performed in the irradiation direction of an angle of θ1, θ2, or θ3. Therefore, the release layer 10A irradiated by laser may have a trapezoidal (FIG. 18) or approximate parallelogram (FIG. 19) cross-sectional profile. By controlling the irradiation location of the laser beam, the heat-affected zone HB may be located at the edge of the rigid element 122 and inclined at an angle. In this way, the flexible substrate 110 is separated from the carrier 20 along separating interfaces Z1 and Z2 when removed from the carrier 20. In other words, in the area not irradiated by the laser beam, the separating interface Z1 is located between the release layer 10 and the flexible substrate 110, and in the area irradiated by the laser, since a portion of the material of the release layer 10A is decomposed, the separating interface Z2 is located between the release layer 10A and the carrier 20. In FIG. 18, the orthographic projections of the separating interface Z1 and the separating interface Z2 on the flexible substrate 110 are overlapped with each other and continuously cover the entire area of the flexible substrate 110, and therefore the flexible substrate 110 may be readily peeled from the carrier 20. The embodiment of FIG. 19 is no different.

Figure 20:
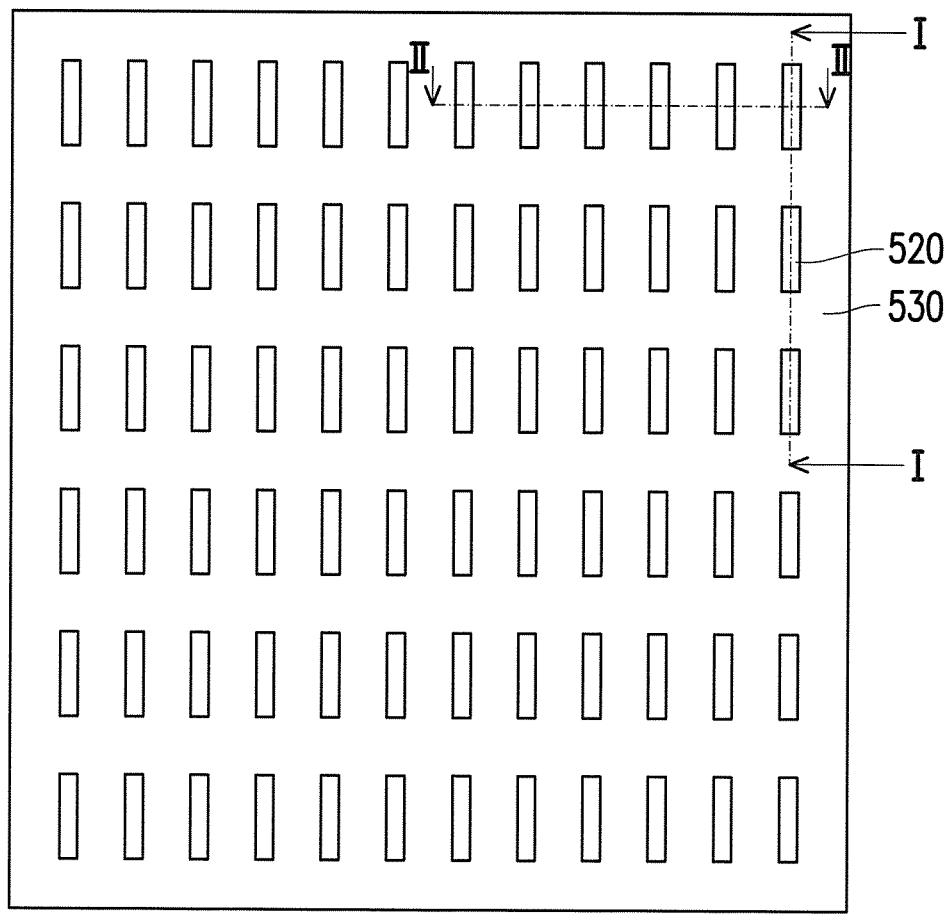
FIG. 20 is a schematic top view of an electronic device structure according to an embodiment of the present disclosure.
Figure 21:
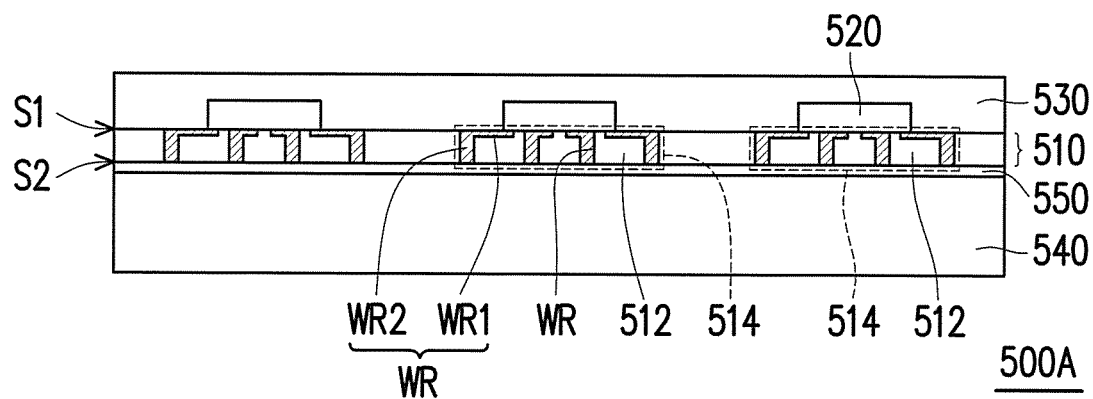
FIG. 21 is a schematic cross-sectional view of the electronic device structure taken along line I-I depicted in FIG. 20.
Figure 22:
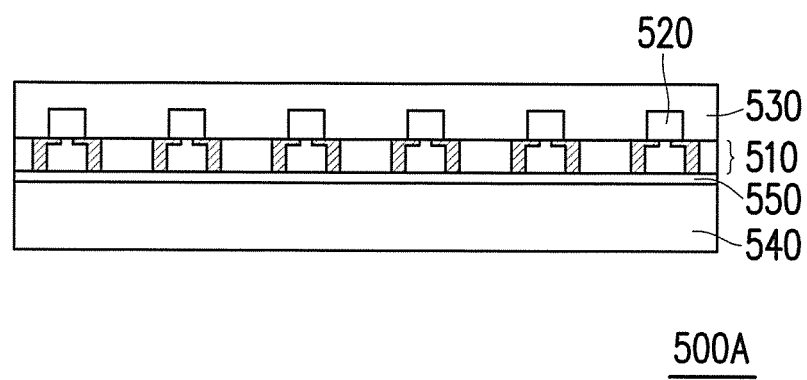
FIG. 22 is schematic cross-sectional view of the electronic device structure taken along II-II depicted in FIG. 20.

FIG. 20 is a schematic top view of an electronic device structure according to an embodiment of the present disclosure. FIG. 21 is a schematic cross-sectional view of the electronic device structure taken along line I-I depicted in FIG. 20 and FIG. 22 is a schematic cross-sectional view of the electronic device structure taken along II-II depicted in FIG. 20. Referring to FIGS. 20, 21 and 22, in the present embodiment, an electronic device structure 500A includes a wire layer 510, a plurality of rigid elements 520, and a molding layer 530 may be sequentially disposed on one side of a carrier 540 with a releasing layer 550 thereon. The releasing layer 550 is formed on the carrier 540 prior to the wire layer 510, the releasing layer 550 is sandwiched between the carrier 540 and the wire layer 510. The wire layer 510 has a first surface S1 and a second surface S2 opposite to the first surface S1. The rigid elements 520 may be disposed on the first surface S1 of the wire layer 510 and are separated from each other by a distance. The molding layer 530 may be disposed on the first surface S1 of the wire layer 510, and the molding layer 530 may cover and encapsulate the rigid elements 520 having the wire layer 510. In one instance, a material of the carrier 540 includes glass, or the like.

FIG. 20 shows the molding layer 530 and the outlines of the rigid elements 520 arranged in an array for illustrating the disposition locations of the rigid elements 520, and other components in the electronic device structure 500A are shown in FIG. 21 and FIG. 22. In addition, the rigid elements 520 shown in FIG. 20 respectively have a rectangle shape for illustration purpose. In an alternative embodiment, the shape of the rigid element 520 can be a square, a hexagon, or other geometric shapes.

The wire layer 510 may include a dielectric matrix 512 and a plurality of wiring units 514. In one instance, the material of the dielectric matrix 512 of the wire layer 510 includes polyimide, PBO, $SiN_x$, $SiO_x$, SiON, or other insulation material. The wiring units 514 are respectively connected to the rigid elements 520. In other words, each rigid element 520 is disposed correspondingly on one wiring unit 514. Each of the wiring layers 510 may include a plurality of wirings WR distributed in the dielectric matrix 512 and the wirings WR may be made of metal material having conductivity to transmit electric signal. In some embodiments, the material of wirings WR may be copper.

In an embodiment, the rigid elements 520 can be a plurality of semiconductor devices, such as chips or dies. The wirings WR in each wiring unit 514 are electrically connected to one rigid element 520 to define the electric transmission path of the rigid element 520 based on the needed layout design. Therefore, in some embodiments, the wire layer 510 can be considered as a redistribution layer (RDL) which helps to fan-out or fan-in the electric connection path of a semiconductor device.

For electric connecting the rigid element 520 and redistributing the electric connection path of the rigid element 520, at least one of the wiring WR includes a fan-out portion WR1 and a conductive via WR2. The fan-out portion WR1 may be disposed on the first surface S1 of the wire layer 510 to be electrically connected to the rigid element 520 thereon, and the conductive via WR2 is connected to the fan-out portion WR1 and passes through the dielectric matrix 512 to extend to the elevation of the second surface S2 of the wire layer 510.

The molding layer 530 covering the rigid elements 520 may be made of epoxy compound or the like capable of protecting the rigid elements 520 and electrically insulating the rigid elements 520 from each other. In the present embodiment, the electronic device structure 500A may include a plurality of semiconductor devices encapsulated on the carrier 540 by the molding layer 530. In an alternative embodiment, the molding layer 530 may not continuously cover the rigid elements 520 and may include a plurality of independent mold patterns respective covering the rigid elements 520.

The rigid elements 520 are independent devices and the rigid elements 520 are predetermined to be connected to an external device through the wire layer 510. The carrier 540 may be removed from the wire layer 510 to expose the second surface S2 of the wire layer 510.

In the present embodiment, the releasing layer 550 is selectively to have a temporary attachment effect to the wire layer 510 so that the wire layer 510 can be separated from the carrier 540 through the releasing layer 550 as desired. In one instance, the releasing force of the releasing layer 550 with respect to the wire layer 510 is less than or equal to 30 gf/cm so as to provide a temporary attachment effect. The releasing force of the releasing layer 550 with respect to the wire layer 510 may be consider as the intensity of the releasing layer 550 attaching to the dielectric matrix 512 of the wire layer 510. The material of the releasing layer 550 can be organic material or inorganic material, for example. In some embodiment, the organic material for fabricating the releasing layer 550 includes polysiloxane, polysiloxane hybridize materials, cyclic olefin copolymers (COC), poly (methyl methacrylate) (PMMA), polyimide (PI), or the like and the inorganic material for fabricating the releasing layer 550 includes $SiO_x$, $SiN_x$, SiON, or the like.

In the present embodiment, the electronic device structure 500A may be fabricated by forming the releasing layer 550 on the carrier 540, forming the wire layer 510 on the releasing layer 550, bonding the rigid elements 520 on the wire layer 510, and encapsulating the rigid elements 520 by the molding layer 530. In an example, the rigid element 520 can be bonded on the wire layer 510 by a flip chip process, a wiring process or a combination thereof.

Figure 23:
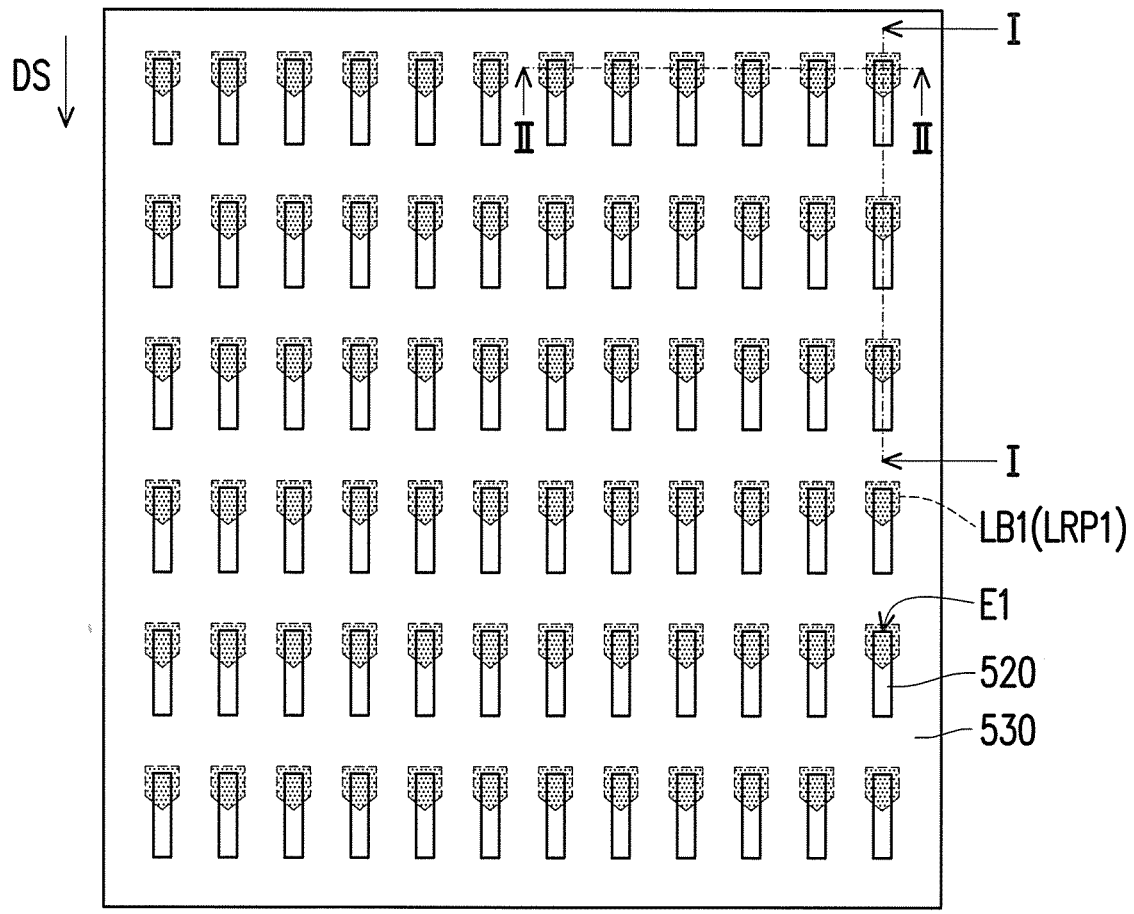
FIG. 23 is a schematic top view of an electronic device structure according to an embodiment of the present disclosure.
Figure 24:
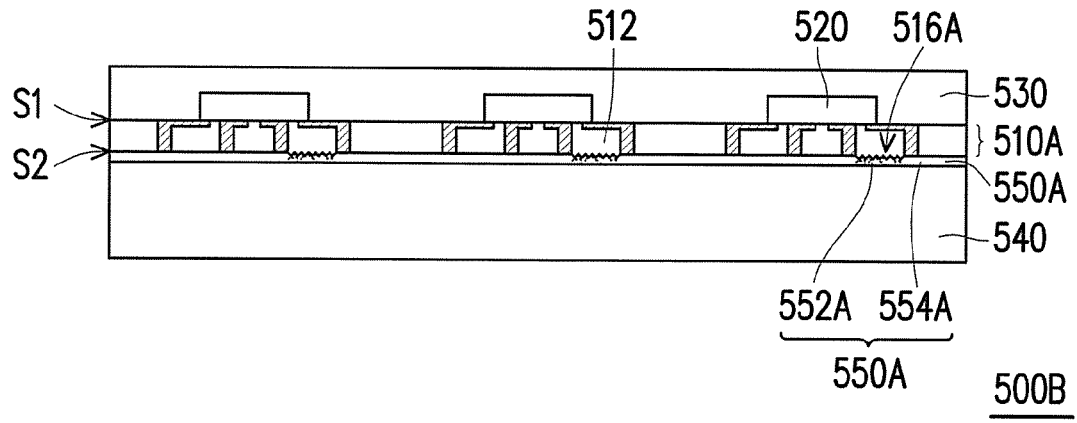
FIG. 24 is a schematic cross-sectional view of the electronic device structure taken along line I-I depicted in FIG. 23.
Figure 25:
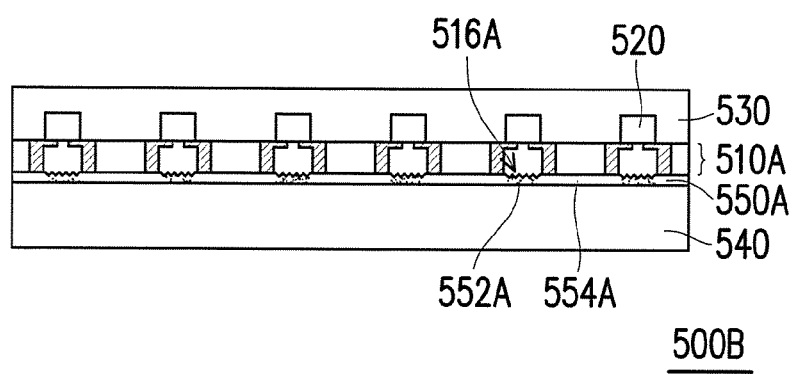
FIG. 25 is a schematic cross-sectional view of the electronic device structure taken along II-II depicted in FIG. 23.

FIG. 23 is a schematic top view of an electronic device structure according to an embodiment of the present disclosure. FIG. 24 is a schematic cross-sectional view of the electronic device structure taken along line I-I depicted in FIG. 23 and FIG. 25 is schematic cross-sectional view of the electronic device structure taken along II-II depicted in FIG. 23. Referring to FIGS. 23, 24 and 25, in the embodiment, the electronic device structure 500B is similar to the electronic device structure 500A depicted in FIG. 20, FIG. 21 and FIG. 22. The electronic device structure 500B is formed by applying an energy beam to the releasing layer 550 of the electronic device structure 500B. The same or similar symbols in the two embodiments can represent the components having the same or similar functions, structure and dispositions. In other words, the electronic device structure 500B may include a wire layer 510A, a plurality of rigid elements 520, and a molding layer 530 disposed on a carrier 540 with a releasing layer 550A thereon, in which the structure, the disposition and the function of the rigid elements 520, the molding layer 530 and the carrier 540 can refer to the foregoing descriptions accompanying with FIG. 20, FIG. 21 and FIG. 22.

In the present embodiment, the energy beam is applied to a portion 552A of the releasing layer 550A along a predetermined path LRP1 while the other portion 554A of the releasing layer 550A does not subject to the energy beam. The predetermined path LRP1 includes a plurality of predetermined spot areas LB1 respectively overlapping the edges E1 of the rigid elements 520. In one instance, the energy beam applied to the releasing layer 550A includes a laser irradiation. The power and the frequency of the laser irradiation can be adjusted based on the material of the releasing layer 550A. Owing to the energy beam applied to the portion 552A of the releasing layer 550A may have a structure different from the other portion 554A of the releasing layer 550A. For example, the portion 552A of the releasing layer 550A may have higher porosity than the other portion 554A of the releasing layer 550A. The density of the portion 552A of the releasing layer 550A may be smaller than the other portion 554A of the releasing layer 550A.

After subjecting to the energy beam, a coarse structure 516A may be formed at the second surface S2 of the wire layer 510A, and for instance may be formed in the dielectric matrix 512 of the wire layer 510A. In the present embodiment, the coarse structure 516A is distributed along with the predetermined path LRP1. As shown in FIG. 23, one predetermined spot area LB1 of the predetermined path LRP1 overlaps with an edge E1 of one rigid element 520 and the coarse structure 516A also overlaps with the edge E1 of each rigid element 520.

Figure 26:
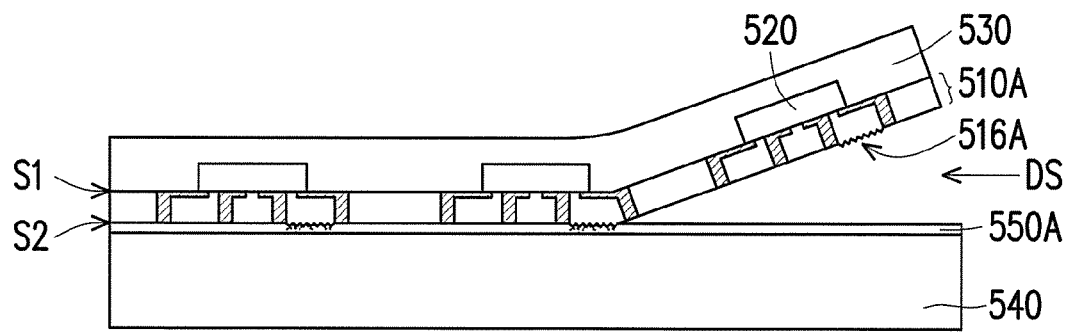
FIG. 26 schematically illustrates a process of removing the carrier depicted in FIGS. 23 to 25 according to an embodiment.

FIG. 26 schematically illustrates a process of removing the carrier depicted in FIGS. 23 to 25 according to an embodiment. Referring to FIG. 26, the carrier 540 is removed from the wire layer 510A via the releasing layer 550A subjected to the energy beam. In the present embodiment, referring to FIG. 23 and FIG. 26 simultaneously, the wire layer 510A is separated from the carrier 540 in a direction DS that the edge E1 of each rigid element 520 subjected to a separating force earlier than the other portion of the rigid element 520. In other words, for the rigid element 520, the separating force is applied to where overlaps with the predetermined spot area LB1 of the predetermined path LRP1 prior to where not overlaps with the predetermined spot area LB1 of the predetermined path LRP1. As such, the rigid elements 520 would not be damaged by the separating force and the separating process may be performed in a higher yield rate. In addition, a peeling effect at the interface between the wire layer 510A and the rigid element 520 due to the separating force may be avoided.

In the case of removing the carrier 540 from the wire layer 510 of the electronic device structure 500A shown in FIGS. 21 and 22, the separating force applied to where the rigid elements 520 are located shall be increased because the stiffness of the rigid element 520 is greater than the wire layer 510. Comparably, as shown in FIGS. 24 and 25, the process of applying the energy beam to the releasing layer 550A may cause the wire layer 510A to be separated from the carrier 540 at the position where the energy beam is applied. The portion of the wire layer 510A with the rigid elements 520 thereon may be easily separated from the carrier 540 and the separating force applied to such portion of the wire layer 510A with the rigid elements 520 thereon may be relatively reduced or need not be increased overly. Owing that the separating force applied to the rigid elements 520 need not be overly increased, the rigid elements 520 may not be damage during the separating process, which improves the yield rate of the fabrication.

Figure 27:
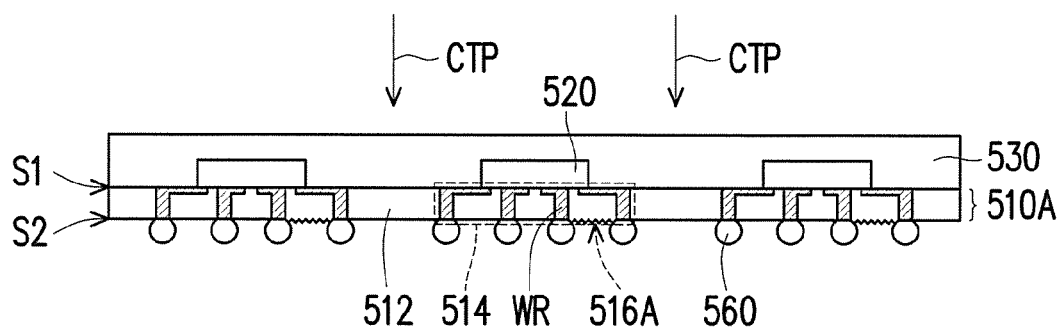
FIG. 27 schematically illustrates an array of electronic device packages obtained by finishing the process depicted in FIG. 26 according to an embodiment.

FIG. 27 schematically illustrates an array of electronic device packages obtained by finishing the process depicted in FIG. 26 according to an embodiment. Referring to FIG. 27, an array 600 of electronic device packages may include the wire layer 510A, the rigid elements 520, the molding layer 530 and the conductive bumps 560. The wire layer 510A may include the dielectric matrix 512 and the wiring units 514, the dielectric matrix 512 may be made of a polymer, which may be a photo-sensitive material such as polybenzoxazole (PBO), polyimide, benzocyclobutene (BCB), or the like, and the wirings WR may be made of metal material such as such as copper, aluminum, tungsten, or the like. The wire layer 510A has a first surface S1 and a second surface S2 opposite to each other, and the second surface S2 has a plurality of coarse structures 516A. The portion of the second surface S2 having the coarse structures 516A has a greater roughness than another portion of the second surface S2. Each of the rigid elements 520 is disposed on the first surface S1. In the present embodiment, the rigid elements 520 may be semiconductor devices, such as chips or dies, and the wire layer 510A may be a redistribution layer. A stiffness of the rigid elements 520 can be greater than a stiffness of the wire layer 510A. In addition, a projection area of the coarse structures 512A on the first surface S1 of the wire layer 510A overlaps a projection area of the rigid elements 520 on the first surface S1 of the wire layer 510A.

In the present embodiment, the array 600 of electronic device packages is obtained by removing the carrier 540 from the electronic device structure 500B depicted in FIG. 25 and FIG. 26, so that the wirings WR of the wiring units 514 are exposed at the second surface S2. It is selectively to form a plurality of conductive bumps 560 on the second surface S2 and the conductive bumps 560 may be respectively connected to the wirings WR exposed at the second surface S2. For instance, each conductive bump 560 can physically contact and electrically connect with one wiring WR at the second surface S2.

Figure 28:
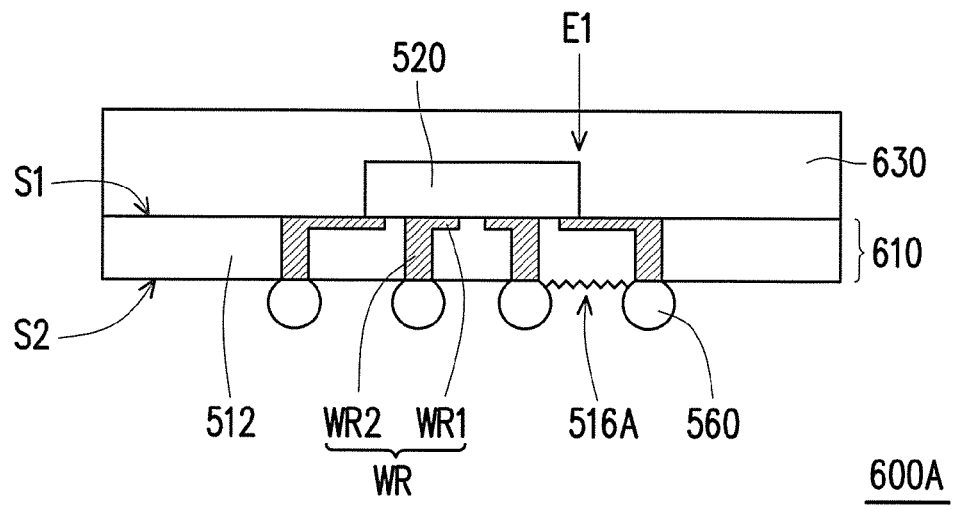
FIG. 28 schematically illustrates a cross-sectional view of an electronic device package according to an embodiment of the present disclosure.

In addition, the rigid elements 520 are encapsulated by the molding layer 530. In the present embodiment, a singulation process may be performed to divide the array 600 of electronic device packages into a plurality of electronic device packages 600A as shown in FIG. 28. In the present embodiment, the singulation process may include cutting the array 600 of electronic device packages along the cutting path CTP shown in FIG. 27. In an example, before the cutting step, a laser mark can be formed on the molding layer 530, the cutting path CTP can be controlled to conform to the laser mark.

FIG. 28 schematically illustrates a cross-sectional view of an electronic device package according to an embodiment of the present disclosure. As shown in FIG. 28, the electronic device package 600A may include a wire layer 610, a rigid element 520, the molding layer 630, and a plurality of conductive bumps 560. In the present embodiment, the rigid element 520 and the conductive bumps 560 may refer to the previous descriptions. The wire layer 610 has a first surface S1 and a second surface S2 opposite to the first surface S1. The rigid element 520 is disposed on the first surface S1. A coarse structure 516A is formed on a portion of the second surface S2. The portion of the second surface S2 having the coarse structure 516A has a greater roughness than another portion of the second surface S2. In addition, a stiffness of the rigid element 520 is greater than a stiffness of the wire layer 610 and a projection area of the coarse structure 516A on the first surface S1 of the wire layer 610 overlaps an edge E1 of the rigid element 520.

The wire layer 610 is formed from the wire layer 510A in FIG. 27, the wire layer 610 may include a dielectric matrix 512 and a plurality of wirings WR distributed in the dielectric matrix 512. The rigid element 520 is electrically connected to the wirings WR. Simultaneously, the coarse structure 516A may be formed on the dielectric matrix 512. In the present embodiment, at least one of the wirings WR may include a fan-out portion WR1 and a conductive via WR2. The fan-out portion WR1 is disposed on the first surface S1 to be electrically connected to the rigid element 520, and the conductive via WR2 is connected to the fan-out portion WR1 and passes through the dielectric matrix 512. The conductive via WR2 is connected to one of the conductive bumps 560 for electrically connecting to an external device through the conductive bumps 560.

Figure 29:
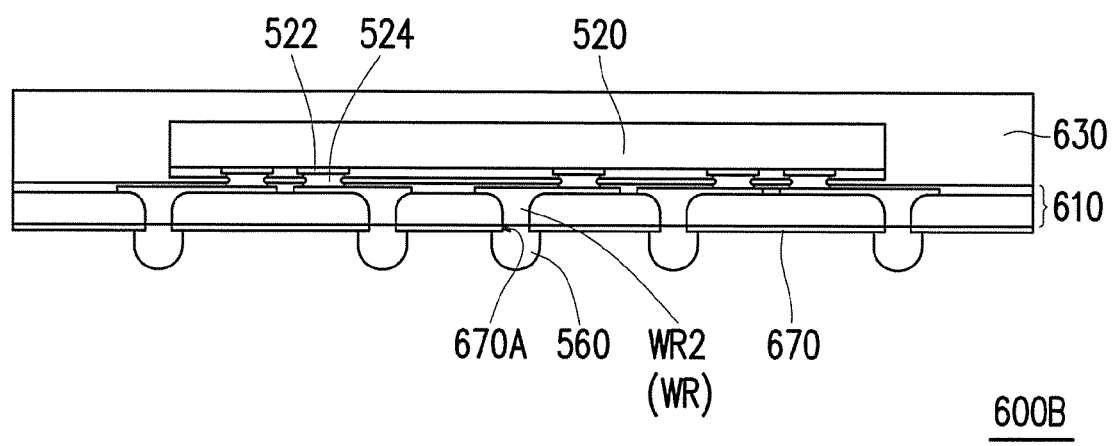
FIG. 29 schematically illustrates an electronic device package according to another embodiment.

FIG. 29 schematically illustrates an electronic device package according to another embodiment. In FIG. 29, the electronic device package 600B may include the wire layer 610, the rigid element 520, the molding layer 630 and the conductive bumps 560 as depicted in FIG. 28, and further include an optional passivation structure 670 disposed on the second surface S2 of the wire layer 610. In the present embodiment, the passivation structure 670 has a plurality of opening 670A and the conductive bumps 560 are respectively located at the openings 570A. Each of the openings 670A exposes a terminal of the conductive via WR2 of one wiring WR at the second surface S2 and accommodates one conductive bump 560. In one instance, the conductive bump 560 can be a solder bump made of solder material including Sn or the like and the passivation structure 670 with the openings 670A can be used for restricting the disposition location of the conductive bump 560 or facilitating the conductive bump 560 to have a ball-like shape. The material of the passivation structure 670 may include a solder resist material such as epoxy, epoxy-acrylate resin, etc. Alternately, the material of the passivation structure 670 may be inorganic material or organic material which is capable of electrically insulting the conductive bumps 560 from each other. In an example, the rigid element 520 can have a plurality of pads 522 exposed at the first surface S1, and a wire or a conductive connector 524 can be formed between the pads 522 and the wirings WR of the wiring unit 514. The design of the pads 522 and the conductive connector 524 of the rigid element 520 can be utilized in the embodiment depicted in FIGS. 20 to 28.

Figure 30:
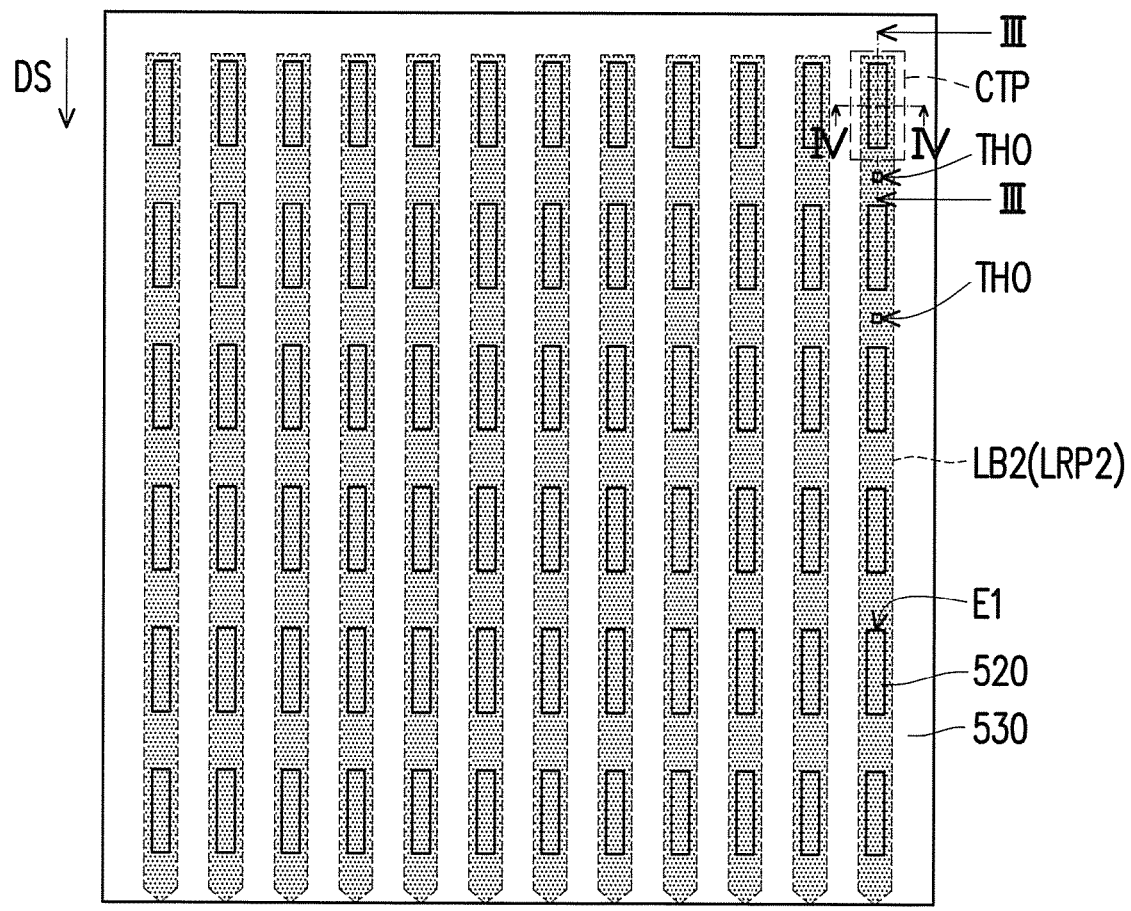
FIG. 30 is a schematic top view of an electronic device structure according to another embodiment of the present disclosure.
Figure 31:
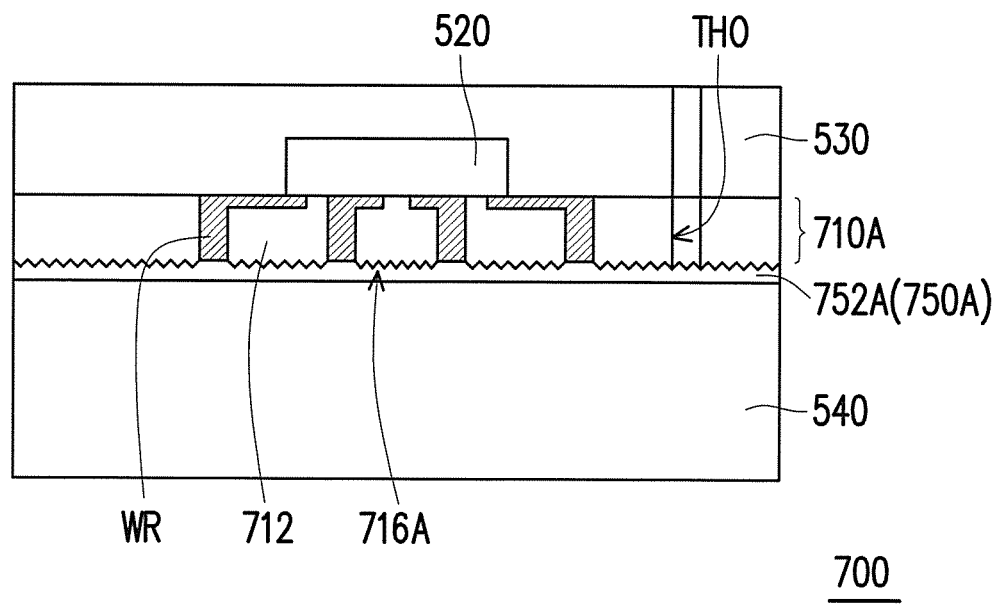
FIG. 31 is a schematic cross-sectional view of the electronic device structure taken along line III-III depicted in FIG. 30.
Figure 32:
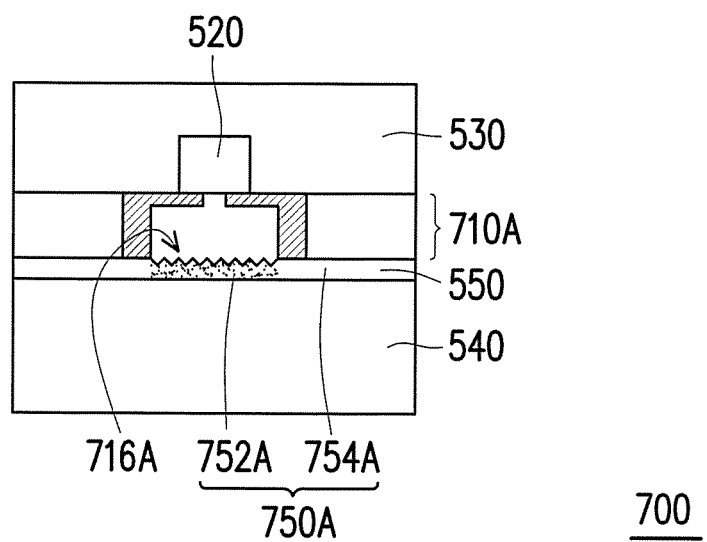
FIG. 32 is a schematic cross-sectional view of the electronic device structure taken along IV-IV depicted in FIG. 30.

FIG. 30 is a schematic top view of an electronic device structure according to another embodiment of the present disclosure. FIG. 31 is a schematic cross-sectional view of the electronic device structure taken along line III-III depicted in FIG. 30 and FIG. 32 is a schematic cross-sectional view of the electronic device structure taken along IV-IV depicted in FIG. 30. Referring to FIGS. 30 to 32, in the present embodiment, the electronic device structure 700, similar to the electronic device structure 500B depicted in FIGS. 23 to 25, may include a wire layer 710A, a plurality of rigid elements 520, and a molding layer 530 disposed on a carrier 540 with a releasing layer 750A thereon. The releasing layer 750A is formed on the carrier 540 prior to the wire layer 710A, the releasing layer 750A is sandwiched between the carrier 540 and the wire layer 710A. The wire layer 710A may include the dielectric matrix 712 and the wirings WR. The rigid elements 520 are disposed on the wire layer 710A, arranged in an array, and separated from each other by a distance. The molding layer 530 covers and encapsulates the rigid elements 520. In brief, the releasing layer 750 depicted in FIGS. 30 to 32 subjected to an energy beam, such as laser irradiation, irradiating along a predetermined path LRP2 while the predetermined path LRP2 includes a plurality of predetermined stripe areas LB2, and the predetermined stripe areas LB2 respectively pass through the rigid elements 520 arranged in one column. In the present embodiment, as shown in FIG. 31 and FIG. 32, the releasing layer 750A includes a portion 752A subjected to the energy beam and the other portion 754A not subjected to the energy beam. In addition, the wire layer 710A can have the coarse structures 716A corresponding to the portion 752A of the releasing layer 750A. In the present embodiment, at least one through hole THO may be formed to pass through the molding layer 630 and the wire layer 710A prior to applying the energy beam to the releasing layer 750A and the predetermined path LRP of the energy beam overlaps with the through hole THO, such that the gas generated by applying the energy beam onto the releasing layer 750A may leak from the through hole THO, which avoids to a stress concentration effect.

In the present embodiment, a separating process can be performed to remove the carrier 540. Under the configuration of the predetermined path LRP2 having parallel predetermined stripe areas LB2, the separating force for removing the carrier 540 may be applied in a direction DS parallel to or substantially parallel to the predetermined stripe areas LB2. The portion 752A of the releasing layer 750A may be treated by the energy beam irradiation, the corresponding portion of the wire layer 710A having the coarse structure 716A can be separated from the carrier 540 before subjecting to the separating force for removing the carrier 540. The separating force for removing the carrier 540 can be reduced, which helps to prevent from the damage of the rigid element 520 caused by the separating force.

Figure 33:
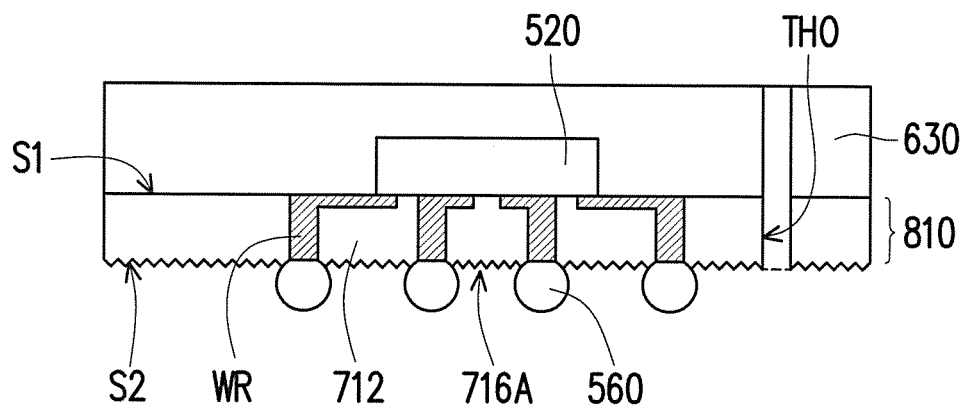
FIGS. 33 and 34 schematically illustrate an electronic device package according to further another embodiment.
Figure 34:
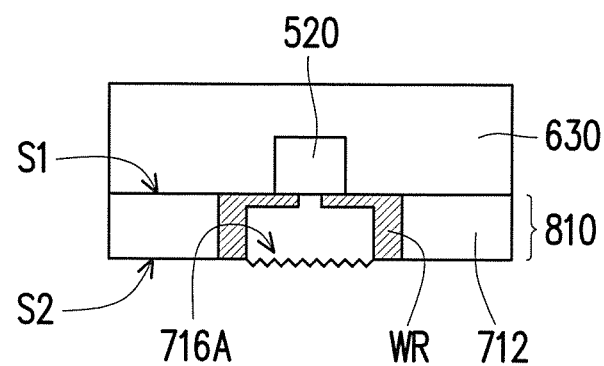

In the present embodiment, a singulation process can be performed after the carrier 540 is removed and the singulation process includes cutting the molding layer 530 and the wire layer 710A along the cutting path CTP shown in FIGS. 30 to 32. Accordingly, an electronic device package 800 shown in FIG. 33 and FIG. 34 is formed. In FIG. 33 and FIG. 34, a single electronic device package 800 can be similar to electronic device package 600A depicted in FIG. 28, and include a wire layer 810, a rigid element 520, the molding layer 630 and a plurality of conductive bumps 560. The wire layer 810 has a first surface S1 and a second surface S2 opposite to the first surface S1. The rigid element 520 is disposed on the first surface S1 and the conductive bumps 560 are disposed on the second surface S2. In addition, the wirings WR of the wire layer 810 are exposed at the second surface S2 for in contact with the conductive bumps 560. In the present embodiment, the projection area of the coarse structure 716A on the first surface S1 of the wire layer 810 overlaps with the whole of the projection area of the rigid element 520 on the first surface S1 of the wire layer 810. Furthermore, at the second surface S2, a portion of the dielectric matrix 712 having the coarse structure 716A has a surface roughness greater than the other portion of the dielectric matrix 712. According to the present embodiment and the embodiment shown in FIG. 28, the distribution of the projection area of the coarse structure 516A or 716A on the first surface S1 of the wire layer 510 or 810 may be determined by the predetermined path LRP1 or LRP2 and overlap with the projection area of the rigid element 520 on the first surface S1 of the wire layer 510 or 810. Therefore, the following embodiments are taken as alternative examples for illustrating different predetermined paths of the energy beam.

Figure 35:
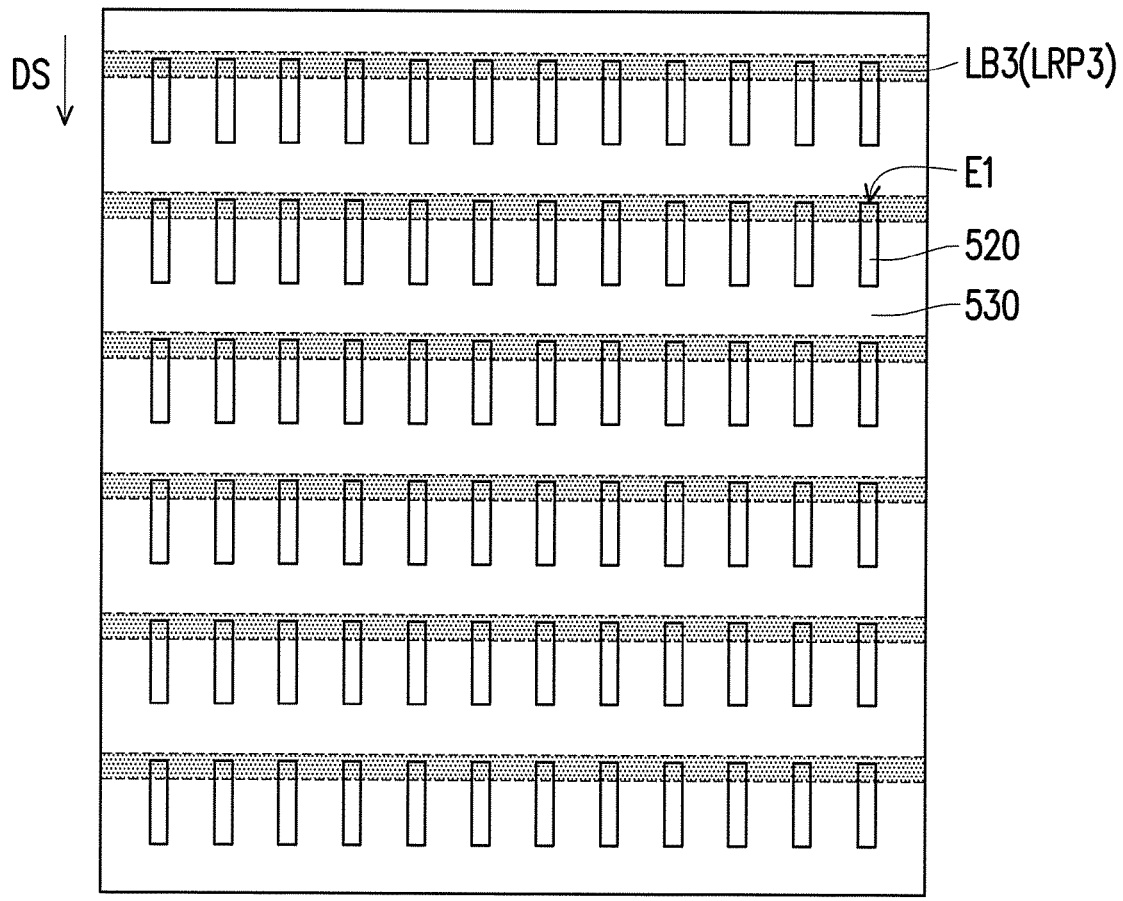
FIG. 35 to FIG. 39 are schematic top views of electronic device structures according to numerous embodiments of the present disclosure.

FIG. 35 to FIG. 39 are schematic top views of electronic device structures according to numerous embodiments of the present disclosure. FIG. 35 to FIG. 39 are utilized to show the electronic device structures 901 to 909 having the rigid elements 520 arranged in an array and the molding layer 530 encapsulating the rigid elements 520. FIG. 35 schematically illustrates the electronic device structure 901 formed by applying an energy beam along the predetermined path LRP3 onto the electronic device structure 500A depicted in FIG. 20. In FIG. 35, the predetermined path LRP3 includes a plurality of predetermined stripe areas LB3, the predetermined stripe areas LB3 pass through the edges E1 of respective rigid elements 520. In the present embodiment, each predetermined stripe area LB3 is extended in the row direction of the array of the rigid elements 520 and thus one predetermined stripe area LB3 passes through the edges E1 of the rigid elements 520 arranged in one row. In addition, each rigid element 520 can have a portion not overlapping with the predetermined path LRP3. In other words, the predetermined path LRP3 may skip over a portion of the projection area of the rigid element 520. The step of removing the carrier as depicted in FIG. 26 may be adopted in the present embodiment by applying the separating force in the direction DS, the portion of each rigid element 520 adjacent to the edges E1 may subject to the separating force prior to the other portion of the said rigid element 520.

Figure 36:
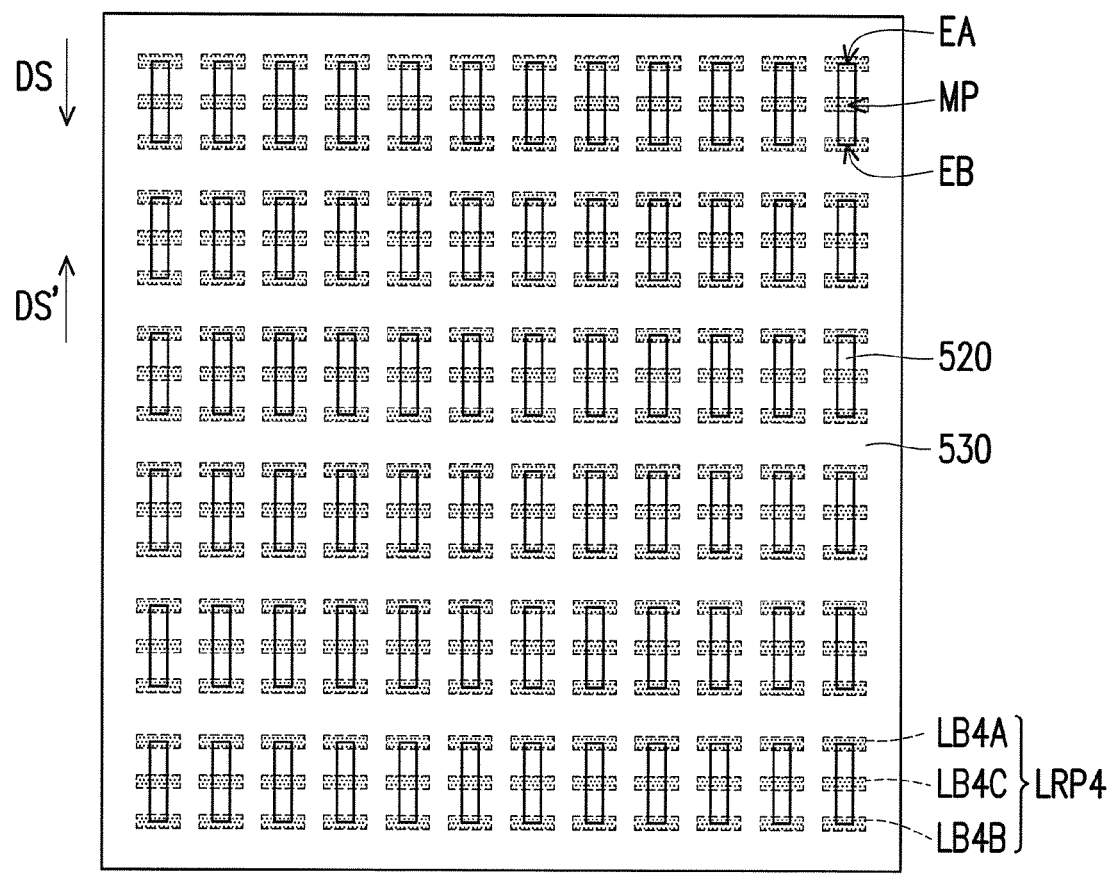

FIG. 36 schematically illustrates the electronic device structure 903 formed by applying an energy beam along the predetermined path LRP4 onto the electronic device structure 500A depicted in FIG. 20. In the present embodiment, the predetermined path LRP4 includes a plurality of predetermined spot areas LB4A, LB4B and LB4C. The predetermined spot areas LB4A respectively overlap with the rigid elements 520 at one edge EA, the predetermined spot areas LB4B respectively overlap with the rigid elements 520 at an edge EB that is opposite to the edge EA correspondingly overlapped with the predetermined spot area LB4A, and the predetermined spot areas LB4C respectively overlap with the rigid element 520 at a middle portion MP between the edge EA and the opposite edge EB. Accordingly, a plurality of coarse structures may be formed at where the predetermined path LRP4 is the projection areas of the coarse structures may overlap with the projection areas of the middle portion MP, the edge EA and the opposite edge EB of the rigid element 520. In the present embodiment, either the edge EA or the edge EB can be an edge predetermined to subject the separating force prior to the other portion of the rigid element 520. The step of removing the carrier as depicted in FIG. 26 may be adopted in the present embodiment by applying the separating force in the direction DS or DS', the portion of each rigid element 520 adjacent to the edge (EA or EB) may subject to the separating force prior to the other portion of the said rigid element 520.

Figure 37:
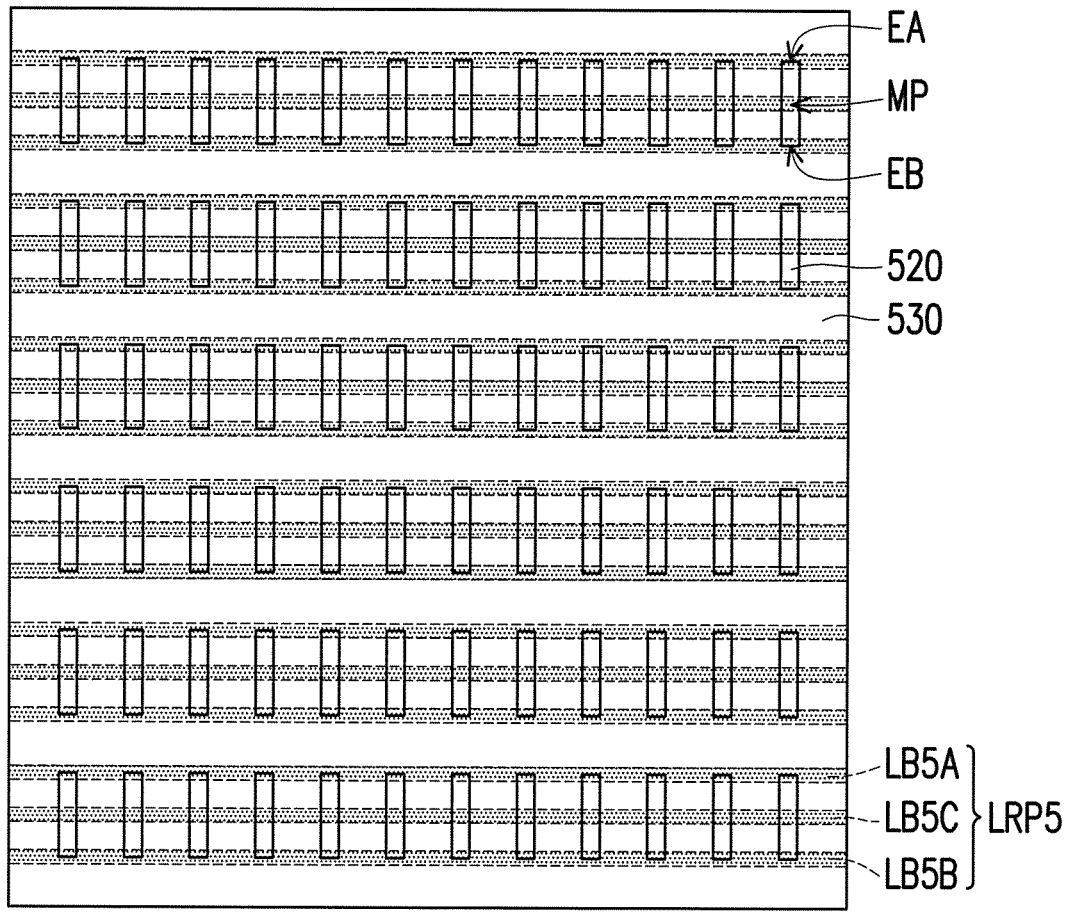

FIG. 37 schematically illustrates the electronic device structure 905 formed by applying an energy beam along the predetermined path LRP5 onto the electronic device structure 500A depicted in FIG. 20. The present embodiment is similar to the embodiment depicted in FIG. 36. The predetermined path LRP5 in the present embodiment includes a plurality of predetermined stripe areas LB5A, LB4B and LB5C. In other words, the path of applying an energy beam onto the electronic device structure 905 is linearly extended. The predetermined stripe areas LB5A respectively overlap with the rigid elements 520 at the edges EA, the predetermined stripe areas LB5B respectively overlap with the rigid elements 520 at the edge EB that is opposite to the edge EA correspondingly overlapped with the predetermined stripe area LB5A, and the predetermined stripe areas LB5C respectively overlap with the rigid element 520 at a middle portion MP between the edge EA and the opposite edge EB. Similar to the embodiment of FIG. 36, either the edge EA or the edge EB can be the edge subjecting to the separating force prior to the other portion of the rigid element 520 in the step of removing the carrier 540.

Figure 38:
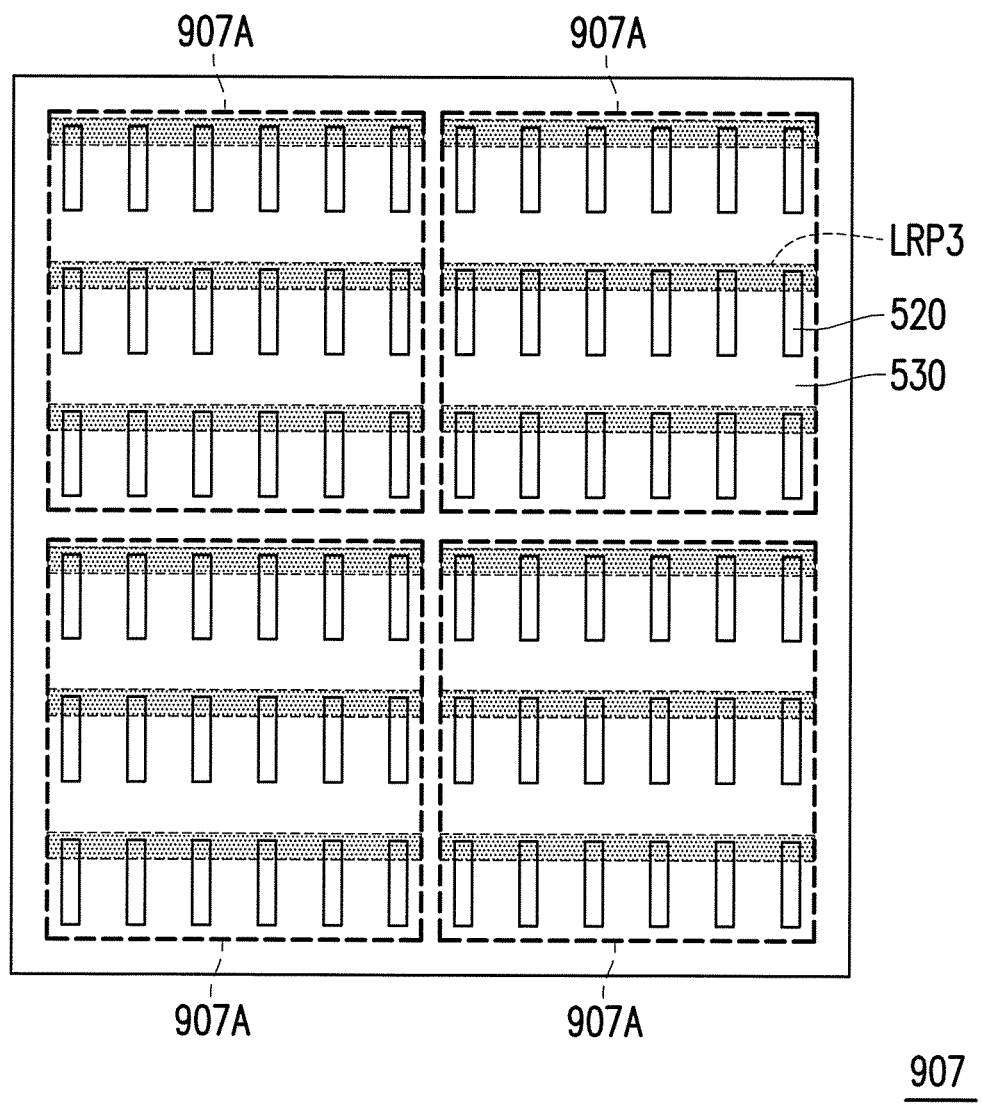
Figure 39:
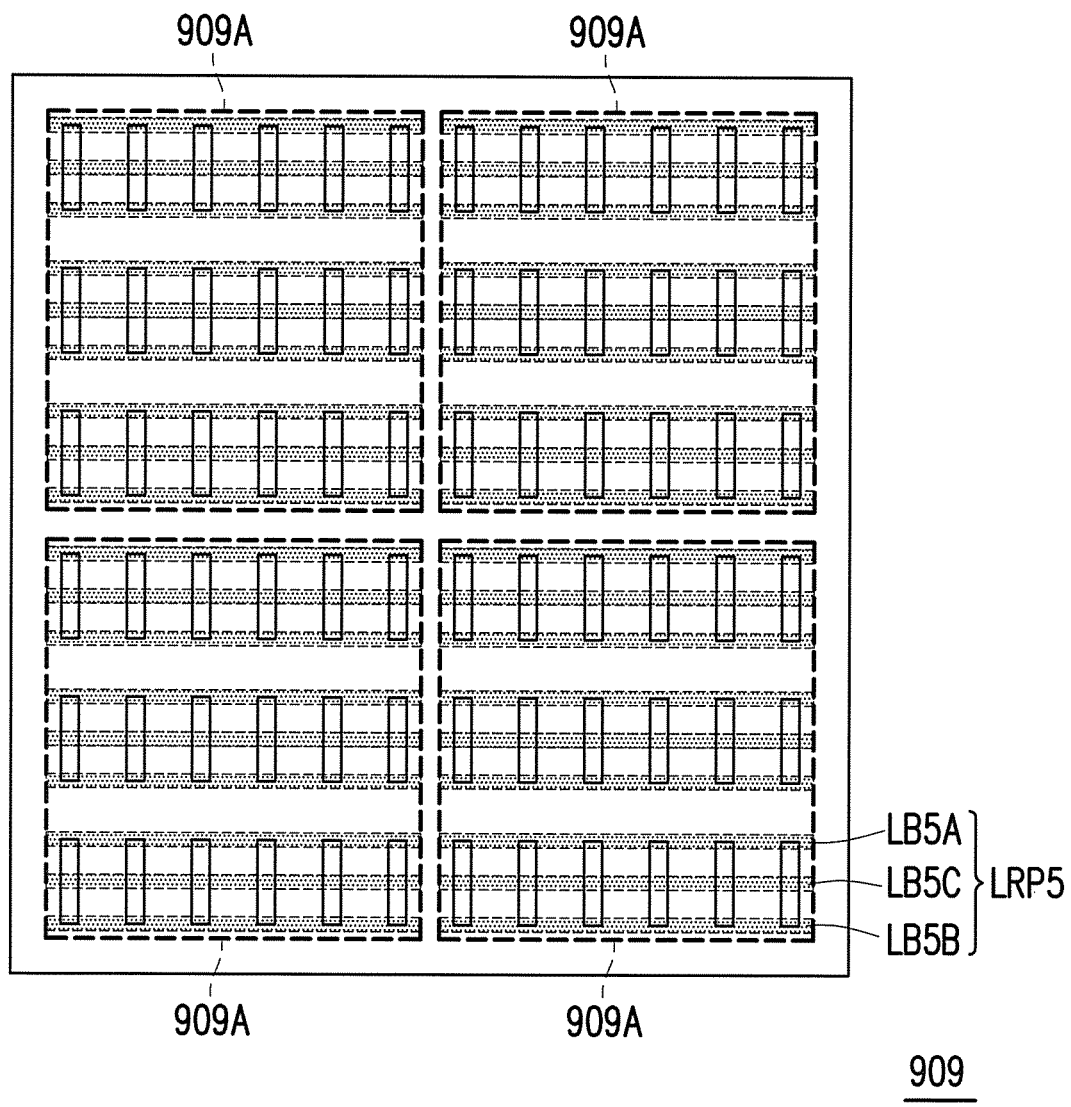

FIG. 38 schematically illustrates the electronic device structure 907 having a plurality of sub regions 907A, each sub region 907A may be similar to the electronic device structure 901 and is subjected to the application of an energy beam along the predetermined path LRP3. In addition, the predetermined path LRP3 in one sub region 907A is not continuous to the predetermined path LRP3 in an adjacent sub region 907A. FIG. 39 schematically illustrates the electronic device structure 909 having a plurality of sub regions 909A, each sub region 909A may be similar to the electronic device structure 905 and is subjected to the application of an energy beam along the predetermined stripe areas LB5A, LB5B and LB5C of the predetermined path LRP5. In addition, the predetermined path LRP5 in one sub region 909A is not continuous to the predetermined path LRP5 in an adjacent sub region 909A.

In the fabrication method of an electronic device structure of the embodiments of the disclosure, before the electronic device package is removed from the carrier, an energy beam application such as a laser irradiation step . . . etc. is first performed on the area having greater stiffness to reduce the separating force needed for this area. The fabrication method of an electronic device package may have a desirable yield. Moreover, the embodiments of the disclosure do not readily damage rigid element on the electronic device package, and the rigid element of the embodiments of the disclosure may have a desirable quality.

It will be clear that various modifications and variations may be made to the disclosed methods and materials. It is intended that the specification and examples be considered as exemplary only, with a true scope of the disclosure being indicated by the following claims and their equivalents.

What is claimed is:

1. An electronic device package, comprising:
   a wire layer comprising a first surface and a second surface opposite to each other, and the second surface of the wire layer having at least one coarse structure, wherein a portion of the second surface having the coarse structure has a greater roughness than another portion of the second surface;
   a rigid element disposed on the first surface of the wire layer, wherein a stiffness of the rigid element is greater than a stiffness of the wire layer;
   a projection area of one of the at least one coarse structure on the first surface of the wire layer overlaps an edge of the rigid element; and
   a molding layer disposed on the first surface of the wire layer to encapsulate the rigid element.

2. The electronic device package of claim 1, wherein the wire layer comprises a dielectric matrix and a plurality of wirings distributed in the dielectric matrix, and the rigid element is electrically connected to the wirings.

3. The electronic device package of claim 2, wherein the coarse structure is formed on the dielectric matrix.

4. The electronic device package of claim 2, wherein at least one of the wirings comprises a fan-out portion and a conductive via, the fan-out portion is disposed on the first surface to be electrically connected to the rigid element, and the conductive via is connected to the fan-out portion and passes through the dielectric matrix.

5. The electronic device package of claim 4, further comprising at least one conductive bump disposed on the second surface of the wire layer and electrically connected to the conductive via.

6. The electronic device package of claim 5, further comprising a passivation structure disposed on the second surface of the wire layer, wherein the passivation structure has at least one opening and the conductive bump is located at the opening.

7. The electronic device package of claim 1, wherein the at least one coarse structure is a plural in quantity, the projection area of another of the coarse structure on the first surface of the wire layer overlaps with another part of the projection area of the rigid element on the first surface of the wire layer at a middle portion of the rigid element.

8. The electronic device package of claim 1, wherein the projection area of the one of the at least one coarse structure overlaps with a whole of a projection area of the rigid element on the first surface of the wire layer.

9. The electronic device structure of claim 1, wherein the wire layer further comprising at least one through hole passing through the wire layer and the molding layer.

10. An electronic device structure, comprising:
    a carrier;
    a wire layer, disposed on the carrier, wherein the wire layer has a first surface and a second surface opposite to each other, the second surface has at least one coarse structure, and a portion of the second surface having the coarse structure has a greater roughness than another portion of the second surface;
    a plurality of rigid elements disposed on the wire layer, wherein each of the rigid elements is disposed on the first surface, a stiffness of the each of the rigid elements is greater than a stiffness of the wire layer, and a projection area of the coarse structure on the first surface of the wire layer overlaps an edge of the each of the rigid elements; and
    a releasing layer disposed between the carrier and the wire layer.

11. The electronic device structure of claim 10, wherein the wire layer comprises a dielectric matrix and a plurality of wiring units distributed in the dielectric matrix, and the rigid elements are electrically connected to the wiring units respectively.

12. The electronic device structure of claim 11, wherein each of the wiring units comprises a plurality of wirings, at least one of the wirings comprises a fan-out portion and a conductive via, the fan-out portion is disposed on the first surface to be electrically connected to the rigid element, and the conductive via is connected to the fan-out portion and passes through the dielectric matrix.

13. The electronic device structure of claim 11, wherein the coarse structure is formed on the dielectric matrix.

14. The electronic device structure of claim 10, further comprising a molding layer disposed on the first surface of the wire layer to encapsulate the rigid elements.

15. The electronic device structure of claim 10, wherein the at least one coarse structure is a plural in quantity, the projection area of another of the coarse structures on the first surface of the wire layer overlaps with another part of the projection area of the each of the rigid elements on the first surface of the wire layer at a middle portion.

16. The electronic device structure of claim 10, wherein the projection area of the at least one coarse structure overlaps with a whole of a projection area of a corresponding rigid element on the first surface of the wire layer.

17. The electronic device structure of claim 10, wherein the rigid elements are a plurality of chips or dies, and a material of the carrier is glass.

18. The electronic device structure of claim 10, wherein a releasing force of the releasing layer with respect to the wire layer is less than or equal to 30 gf/cm.

19. The electronic device structure of claim 10, wherein the wire layer further comprising at least one through hole passing through the wire layer and the molding layer.

20. A method of fabricating an electronic device package, comprising:
   temporarily disposing a wire layer on a carrier with a release layer being located between the carrier and the wire layer, wherein the wire layer has a first surface and a second surface, and the second surface is in contact with the release layer;
   forming at least one rigid element on the first surface of the wire layer to form a first area and a second area, and a stiffness of a portion of the first area is greater than a stiffness of the second area; and
   irradiating a laser beam from the carrier toward the release layer located in the first area, wherein a predetermined path of the laser beam falls in the first area.

21. The method of claim 20, further removing the carrier from the wire layer through the releasing layer in a direction that an edge of the rigid element subjected to a separating force earlier than the other portion of the rigid element, wherein the predetermined path overlaps with the edge.

22. The method of claim 20, wherein the predetermined path overlaps with the rigid element at an edge.

23. The method of claim 20, wherein the predetermined path overlaps with the rigid elements at an edge and an opposite edge.

24. The method of claim 20, wherein the predetermined path overlaps with the rigid elements at an edge, an opposite edge and a middle portion between the edge and the opposite edge.

* * * * *